United States Patent
Zhu et al.

(10) Patent No.: US 12,245,495 B2
(45) Date of Patent: Mar. 4, 2025

(54) BACKBONE-ENGINEERED HIGHLY EFFICIENT POLYMER HOLE TRANSPORTING MATERIALS, INVERTED PEROVSKITE SOLAR CELLS MADE THEREFROM, AND MANUFACTURING METHODS THEREFOR

(71) Applicant: City University of Hong Kong, Kowloon (HK)

(72) Inventors: Zonglong Zhu, Kowloon (HK); Xin Wu, Kowloon (HK); Xianglang Sun, Kowloon (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 18/336,314

(22) Filed: Jun. 16, 2023

(65) Prior Publication Data
US 2024/0423083 A1    Dec. 19, 2024

(51) Int. Cl.
| | |
|---|---|
| *H10K 85/10* | (2023.01) |
| *H10K 30/86* | (2023.01) |
| *H10K 71/12* | (2023.01) |
| *H10K 77/10* | (2023.01) |
| H10K 30/50 | (2023.01) |
| H10K 30/85 | (2023.01) |

(52) U.S. Cl.
CPC .......... *H10K 85/111* (2023.02); *H10K 30/86* (2023.02); *H10K 71/12* (2023.02); *H10K 77/10* (2023.02); H10K 30/50 (2023.02); H10K 30/85 (2023.02)

(58) Field of Classification Search
None
See application file for complete search history.

(56) References Cited

U.S. PATENT DOCUMENTS

| | | | |
|---|---|---|---|
| 2019/0019628 A1* | 1/2019 | Higuchi | H10K 30/151 |
| 2019/0164699 A1* | 5/2019 | Zeng | H10K 85/30 |
| 2024/0081144 A1* | 3/2024 | Gao | H10K 85/631 |
| 2024/0121970 A1* | 4/2024 | Gehan | H10K 85/621 |

OTHER PUBLICATIONS

ÂSupporting Information for Adv. Mater., DOI: 10.1002/adma. 202208431 (Year: 2023).*

(Continued)

*Primary Examiner* — Ryan S Cannon
(74) *Attorney, Agent, or Firm* — Renner, Kenner, Greive, Bobak, Taylor & Weber

(57) ABSTRACT

The invention develops a novel hole-transporting material (HTM), PTAA-P1 and PTAA-P2 via the backbone engineering strategy to modulate wettability and promote anchoring. The HTM properties can be effectively modified by varying the linkage sites of incorporated pyridine units. The 3,5-linked PTAA-P1 particularly demonstrates a more regulated molecular configuration for interacting with perovskites, forming a highly crystalline perovskite film with uniform back contact and reduced defect density. The invention also develops the perovskite solar cell including the novel HTM with remarkable PCE efficiency and stability for small-area and large-area solar cells. The invention also develops the method for fabricating the perovskite solar cell.

18 Claims, 28 Drawing Sheets

(56) References Cited

OTHER PUBLICATIONS

Tert-butyl SDS [retrieved from https://www.sigmaaldrich.com/US/en/product/aldrich/142379 on Jun. 11, 2024] (Year: 2024).*

Tepliakova, M. M., Akkuratov, A. V., Tsarev, S. A. & Troshin, P. A. Suzuki polycondensation for the synthesis of polytriarylamines: A method to improve hole-transport material performance in perovskite solar cells. Tetrahedron Lett. 61, 152317 (2020).

Wang, J. et al. Dopant-Free Hole-Transporting Material with Enhanced Intermolecular Interaction for Efficient and Stable n-i-p Perovskite Solar Cells. Adv. Energy Mater. 11, 2100967 (2021).

Sun, X. et al. Efficient Inverted Perovskite Solar Cells with Low Voltage Loss Achieved by a Pyridine-Based Dopant-Free Polymer Semiconductor. Angew. Chem. Int. Ed. 60, 7227-7233 (2021).

Wang, D. et al. Interfacial Engineering of Wide-Bandgap Perovskites for Efficient Perovskite/CZTSSe Tandem Solar Cells. Adv. Funct. Mater., 32, 2107359 (2021).

Li, F. et al. Regulating surface termination for efficient inverted perovskite solar cells with greater than 23% efficiency. J. Am. Chem. Soc. 142, 20134-20142 (2020).

Yang, X. et al. Buried interfaces in halide perovskite photovoltaics. Adv. Mater. 33, 2006435 (2021).

Xin Wu, et. al. Backbone Engineering Enables Highly Efficient Polymer Hole-Transporting Materials for Inverted Perovskite Solar Cells Adv. Mater. 2023, 2208431.

* cited by examiner

BACKBONE-ENGINEERED HIGHLY EFFICIENT POLYMER HOLE TRANSPORTING MATERIALS, INVERTED PEROVSKITE SOLAR CELLS MADE THEREFROM, AND MANUFACTURING METHODS THEREFOR

FIELD OF THE INVENTION

This invention relates to a polymer hole transporting material and a perovskite solar cell made therefrom. Specifically, this invention relates to an optimized polymer hole transporting material and an inverted perovskite solar cell.

BACKGROUND OF THE INVENTION

Perovskite solar cells (PVSCs) have drawn unprecedented attention due to their low-cost solution processability, unique optoelectronic properties, and high power conversion efficiency (PCE) comparable to most commercialized PV technologies. Compared with the conventional (n-i-p) PVSCs, inverted (p-i-n) PVSCs possessed the merits of low-temperature processability and more promising operational stability, enabling the suitability for wearable electronics and large-area fabrication. Nevertheless, although the highest PCE of inverted PVSCs (25.37%) has been boosted to be close to the conventional ones, an efficiency gap remains. The interfaces and perovskite crystallinity play a critical role in determining device performance, which is remarkably affected by the bottom hole-transporting layer (HTL) in the case of inverted PVSCs. However, the hole-transporting materials (HTMs) widely used for inverted PVSCs, that is, poly(bis(4-phenyl) (2,4,6-trimethylphenyl) amine) (PTAA), have been reported to cause poor bottom contact and inferior perovskite crystallinity due to the unfavorable wettability and absence of strong chemical bonds with perovskites (FIG. 1, left), thereby limiting device performance. In addition, non-wetting PTAA has been illustrated as unsuitable for fabricating large-area perovskite solar modules.

Various strategies for modulating the bottom interface and perovskite crystallization have recently been explored to improve the PCEs of PTAA-based inverted PVSCs. A small amount of surfactants have been incorporated into perovskite precursors to increase their adhesion with the non-wetting PTAA, resulting in smooth perovskite films with low defect density. A novel hydrophilic buffer layer is introduced to bridge perovskite and PTAA to achieve pinhole-free perovskite film with improved crystallinity. Moreover, dual interface modification by incorporating large organic cations has been developed to simultaneously enhance the open-circuit voltage ($V_{OC}$) and fill factor (FF) of inverted PVSCs. In spite of these achievements, the majority of strategies require the application of additional materials as surfactants, thereby increasing the complexity of device fabrication. Nevertheless, the resulting PCEs are still below 24%. Most of the recently reported high-performance HTMs could only afford PCEs of about 23%, and few of them are suitable for large-area devices.

It is acknowledged that the commonly-used PTAA has the drawbacks of inferior wettability, weak anchoring strength with perovskite, as well as uncontrolled crystal growth. Thus, considering the importance of bottom HTL in inverted PVSCs, it would be imperative to develop HTMs with superior properties that can directly and simultaneously modulate the interface and perovskite crystallinity to realize PCEs equivalent to those conventional ones.

SUMMARY OF THE INVENTION

An embodiment of the present invention relates to a hole-transporting material for a perovskite solar cell includes poly(bis(4-phenyl) (2,4,6-trimethylphenyl)amine) and at least one pyridine.

An embodiment of the present invention also relates to a method for fabricating the perovskite solar cell, including the steps of:
(a) providing a substrate;
(b) providing a hole-transporting material;
(c) coating the hole-transporting material onto the substrate;
(d) providing a perovskite precursor; and
(e) coating the perovskite precursor onto the substrate of (c).

Without intending to be limited by theory, it is believed that the present invention may provide novel-designed HTMs that can modulate the wettability and promote the anchoring by introducing pyridine units into the polyarylamine backbone. Without intending to be limited by theory, it is believed that the present invention may provide a simple but efficient backbone engineering strategy to develop high-performance polymer HTMs for inverted PVSCs to realize efficient and stable inverted PVSCs. The HTM properties can be effectively modified by varying the linkage sites of pyridine units, and 3,5-linked PTAA-P1 particularly demonstrates a more regulated molecular configuration for interacting with perovskites, leading to highly crystalline perovskite films with uniform bottom contact and reduced defect density. Without intending to be limited by theory, it is believed that the present invention may provide a dopant-free novel HTM-based inverted PVSCs of which the remarkable efficiencies of 24.89% for small-area (0.08 $cm^2$) as well as 23.12% for large-area (1 $cm^2$) devices. Moreover, the unencapsulated device maintains over 93% of its initial efficiency after 800 h of maximum power point tracking under simulated AM 1.5G illumination.

Without intending to be limited by theory, it is believed that the present invention may provide two types of novel polymer HTMs (FIG. TA, right) that are synthesized by introducing a small amount of pyridine units with different linkage sites into the main chain of polyarylamine. It has been found that the interactions between the pyridine units and lead ions ($Pb^{2+}$) could simultaneously modulate the molecular conformation of HTMs and the crystallinity of resultant perovskite films. In particular, the 3,5-linked PTAA-P1 exhibits a more regulated molecule configuration than 2,5-linked PTAA-P2 and pristine PTAA, resulting in highly crystalline perovskite films with uniform back contact and low defect density. Dopant-free small-area inverted PVSCs based on PTAA-P1 not only achieve a remarkable PCE of 24.89%, among the highest PCE of inverted PVSCs reported so far, but also exhibit superior device stability, unencapsulated device maintained over 93% of its initial PCE after 800 h of maximum power point (MPP) tracking under simulated AM 1.5G illumination. Furthermore, large-area inverted PVSCs (1 $cm^2$) based on PTAA-P1 with a high PCE of 23.12% are also successfully fabricated, indicating the suitability of PTAA-P1 for the scaling up of PVSCs.

Figure 1A:
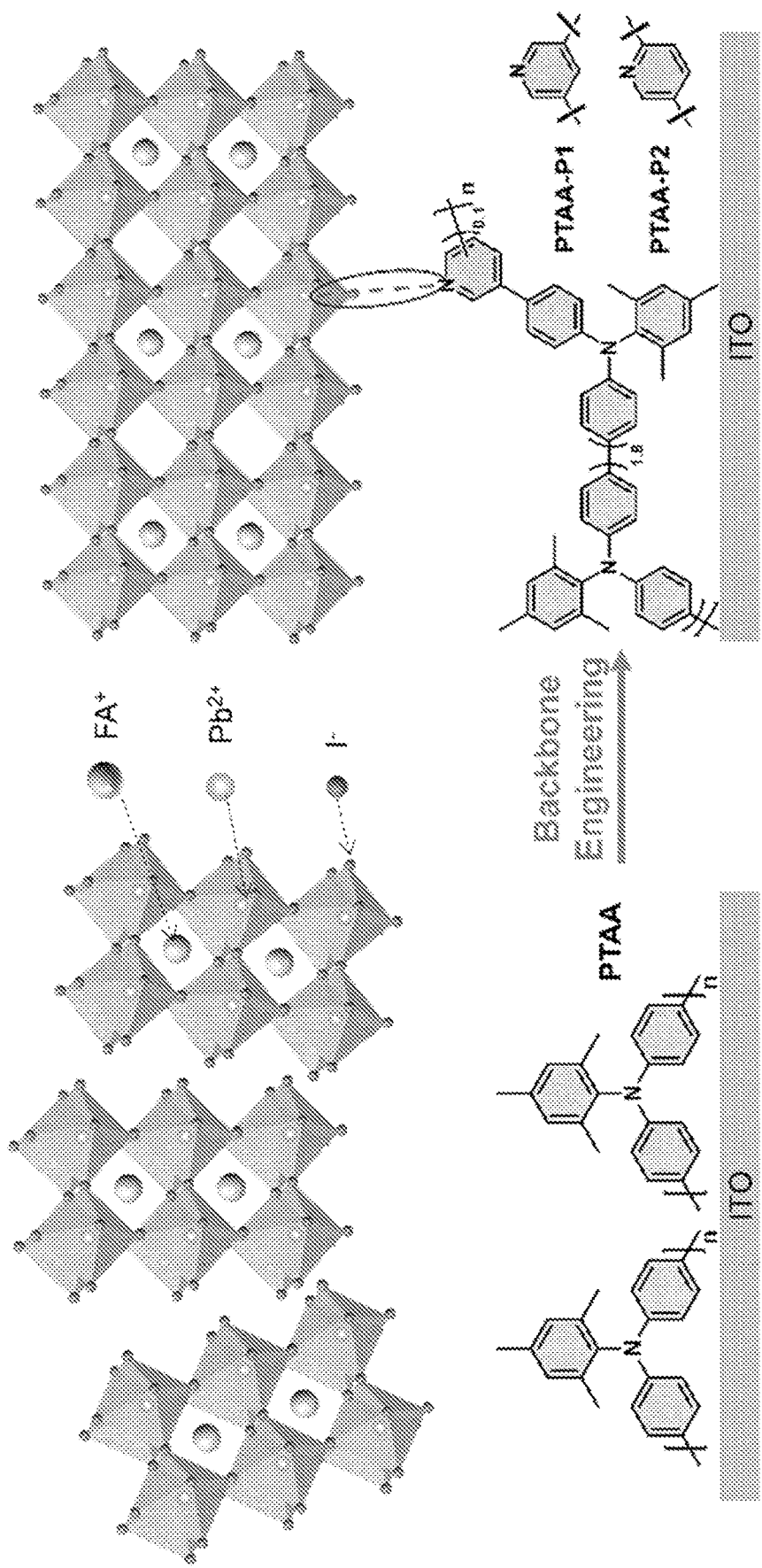
FIG. 1A is a diagram showing a design principle and molecular structures of synthesized HTMs: PTAA-P1 and PTAA-P2.

The figures herein are for illustrative purposes only and are not necessarily drawn to scale.

DETAILED DESCRIPTION OF PREFERRED EMBODIMENTS

Unless otherwise specifically provided, all tests herein are conducted at standard conditions, which include a room and testing temperature of about 25° C., sea level (1 atm.) pressure, and pH 7, and all measurements are made in metric units. Furthermore, all percentages, ratios, etc., herein are by weight, unless specifically indicated otherwise. It is understood that unless otherwise specifically noted, the materials compounds, chemicals, etc., described herein are typically commodity items and/or industry-standard items available from a variety of suppliers worldwide.

As used herein the term "dopant" refers to an additional atom or molecule co-dissolved or otherwise integrated with the hole transporting materials for the purpose of enhancing the hole mobility of solar cells.

An embodiment of the present invention relates to a hole-transporting material for a perovskite solar cell includes poly(bis(4-phenyl) (2,4,6-trimethylphenyl)amine) and at least one pyridine, where the pyridine may be linked to the poly(bis(4-phenyl) (2,4,6-trimethylphenyl)amine). Without intending to be limited by theory, it is believed that the pyridine unit strongly coordinates with perovskites, thereby strengthening the interface of hole-transporting materials and perovskite.

In an embodiment herein, a linkage position is selected from the group of a 3,5-site of the pyridine and a 2,5-site of the pyridine and a combination thereof. Without intending to be limited by theory, it is believed that a 3,5-linked molecule may possesses a more regulated conformation to construct a better interface with perovskites.

In an embodiment herein, a relative molar ratio of the pyridine to the monomer of poly(bis(4-phenyl) (2,4,6-trimethylphenyl)amine) in the hole-transporting materials ranges from about 1:100 to 1:10; or about 1:20. Without intending to be limited by theory, it is believed that the best relative amount of pyridine is 1:20. It is believed that too much pyridine results in the reduction of the charge carrier mobility of hole-transporting material.

In an embodiment herein, the hole-transporting material is substantially free of a dopant. Without intending to be limited by theory, it is believed that this dopant-free nature could reduce the complexity of the preparation process, avoid the instability caused by the dopants and enable stable perovskite solar cells.

In an embodiment herein, the hole-transporting material for a perovskite solar cell includes a structure selected from Formula (I), Formula (II) and a combination thereof:

Formula (I)

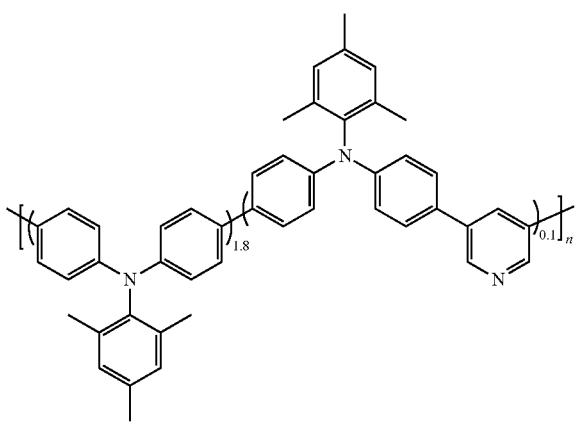

PTTA-P1

Formula (II)

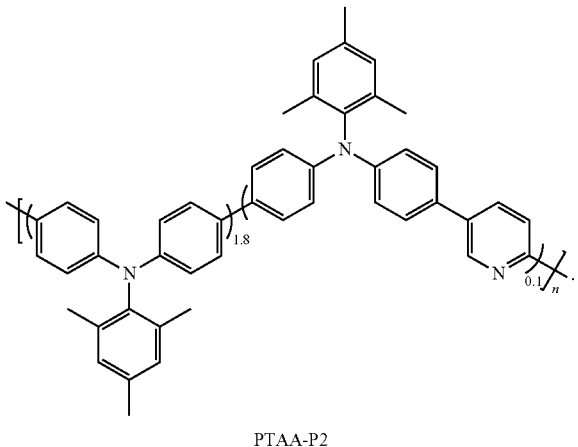

PTAA-P2

Without intending to be limited by theory, it is believed that the molecules containing poly(bis(4-phenyl) (2,4,6-trimethylphenyl)amine) (PTAA), pyridine unit, PTAA-P1 and/or PTAA-P2, may possess suitable energy levels, superior hole mobility, and/or intense interaction with perovskites than PTAA, which is beneficial for the realization of efficient and stable perovskite solar cells.

An embodiment of the present invention also relates to a perovskite solar cell including a bottom hole-transporting layer, where the bottom hole-transporting layer includes the hole-transporting material.

In an embodiment herein, the perovskite solar cell includes an inverted-structure perovskite solar cell including a bottom hole-transporting layer, where the bottom hole-transporting layer includes the hole-transporting material. Without intending to be limited by theory, it is believed that the inverted perovskite solar cell possesses outstanding long-term operational stability in comparison with normal structured perovskite solar cell.

In an embodiment herein, the bottom hole-transporting layer is a p-type hole-transporting layer. Without intending to be limited by theory, it is believed that a p-type hole-transporting layer possesses high hole mobility and well-matched energy level to facilitate the interfacial charge transfer. These properties may ensure HTM with high transporting capability of holes and sufficient built-in electrical field for charge extraction.

In an embodiment herein, the perovskite solar cell further includes a substrate, a perovskite active layer, an n-type electron-transporting layer, a blocking layer and a metal electrode. Without intending to be limited by theory, it is believed that the p-i-n structure of PVSC may provide the effective charge generation, separation, and collection to realize efficient perovskite solar cell.

In an embodiment herein, the perovskite active layer consists essentially of $Pb^{2+}$. Without intending to be limited by theory, it is believed that the $Pb^{2+}$ may enable perovskite to possess low exciton binding energy, high carrier mobility and suitable bandgap for solar cell fabrication.

In an embodiment herein, the pyridine in the hole-transporting material coordinates with the $Pb^{2+}$ through a Pb—N bond. Without intending to be limited by theory, it is believed that the coordination may simultaneously modulate the interfacial conformation and crystallization of perovskites via the $Pb^{2+}$/pyridine interaction.

In an embodiment herein, the perovskite solar cell further includes a substrate, and the p-type hole-transporting layer is coated on the substrate, the perovskite active layer is coated on the p-type hole-transporting layer, the n-type electron-transporting layer is coated on the perovskite active layer, the blocking layer is coated on the n-type electron-transporting layer, and the metal electrode is coated on the blocking layer. Without intending to be limited by theory, it is believed that the structure of perovskite solar cell may enable effective repeated charge generation, extraction, and collection, as well as easy fabrication via solution process, which is critical for their future commercialization.

In an embodiment herein, the substrate is selected from glass/ITO substrate, glass/FTO substrate and PET/ITO substrate. Without intending to be limited by theory, it is believed that the glass/ITO substrate, glass/FTO substrate and PET/ITO substrate may possess high conductivity and a small/minute surface roughness, which may be beneficial for the deposition of other functional layers on it.

In an embodiment herein, the electron-transporting layer is selected from the group of $C_{60}$, ZnO, $C_{70}$ and a combination thereof. Without intending to be limited by theory, it is believed that $C_{60}$ may be preferred due to its high electron mobility, and well-matched energy level with perovskites, contributing to high power conversion efficiency of inverted perovskite solar cell.

In an embodiment herein, the blocking layer is selected from bathocuproine, ALD-SnO$_x$, V$_2$O$_5$ and a combination thereof. Without intending to be limited by theory, it is believed that BCP may be preferred due to easy processing, suitable energy level and superior ion blocking properties.

In an embodiment herein, the metal electrode is selected from the group of silver, gold copper and a combination thereof. Without intending to be limited by theory, it is believed that silver is preferred as electrode material owing to its superior conductivity than copper and lower cost than gold. Moreover, silver is printable for further upscaling.

In an embodiment herein, the substrate contains ITO, the n-type electron-transporting layer contains $C_{60}$, the blocking layer contains bathocuproin, and the metal electrode contains silver. Without intending to be limited by theory, it is believed that the ITO/the hole-transporting material/perovskite/$C_{60}$/bathocuproine/Ag structure may outperform others due to higher PCE efficiency and more efficient charge carrier dynamics via different functional layers.

An embodiment herein of the present invention relates to a method for fabricating the perovskite solar cell, including the steps of.
(f) providing a substrate;
(g) providing a hole-transporting material;
(h) coating the hole-transporting material onto the substrate;
(i) providing a perovskite precursor; and
(j) coating the perovskite precursor onto the substrate of (c).

In an embodiment herein, the hole-transporting material is prepared in solution and perovskite precursor is prepared in solution. Without intending to be limited by theory, it is believed that the solution processability of this method may reduce the cost of solar cell fabrication, and may make perovskite solar cells compatible with large-scale production leading to easier commercialization.

Without intending to be limited by theory, it is believed that the present invention may provide various types of new dopant-free polymer HTMs for inverted PVSCs modified by backbone engineering strategy, in which small amounts of pyridine units with varying linkage sites are incorporated into the PTAA backbone through random copolymerization. The N—Pb bonds between pyridine units and Pb$^{2+}$ are found to simultaneously impact the molecular conformation of the HTM and the crystallinity of resultant perovskite films. DFT simulation suggests that 3,5-linked PTAA-P1 possesses more ordered molecular regularity than 2,5-linked PTAA-P2.

The perovskites grown on PTAA-P1 are believed to possess enhanced crystallinity, satisfying bottom contact, as well as low defect density relative to those deposited on PTAA-P2 and PTAA. As a result, the simultaneous modulation of interface and crystallinity by PTAA-P1 may realize not only a remarkable PCE of 24.89% for small-area devices (e.g., 0.08 cm$^2$), among the highest values reported for inverted PVSCs so far, but also a high PCE of 23.12% for large-area inverted PVSCs (e.g., 1 cm$^2$). Moreover, it is believed that PTAA-P1-based devices exhibit outstanding long-term stability, and the unencapsulated device may maintain over 93% of its original efficiency after 800 h of MPP tracking under simulated AM 1.5G illumination. Thus, it is believed that the rational design of HTMs is a facile and effective strategy to boost the performance and stability of inverted PVSCs.

Without intending to be limited by theory, it is believed that a device of an inverted perovskite solar cell may include, in order, a substrate layer, a p-type hole-transporting layer, a perovskite active layer, an n-type electron-transporting layer, a blocking layer, and a metal electrode.

Turning to the figures, FIG. 1A shows the design principle of HTMs of the present invention. A backbone engineering strategy is employed to modify the structure of PTAA by incorporating a small amount of pyridine groups into the polyarylamine to strengthen its coordination with perovskite.

Figure 1B:
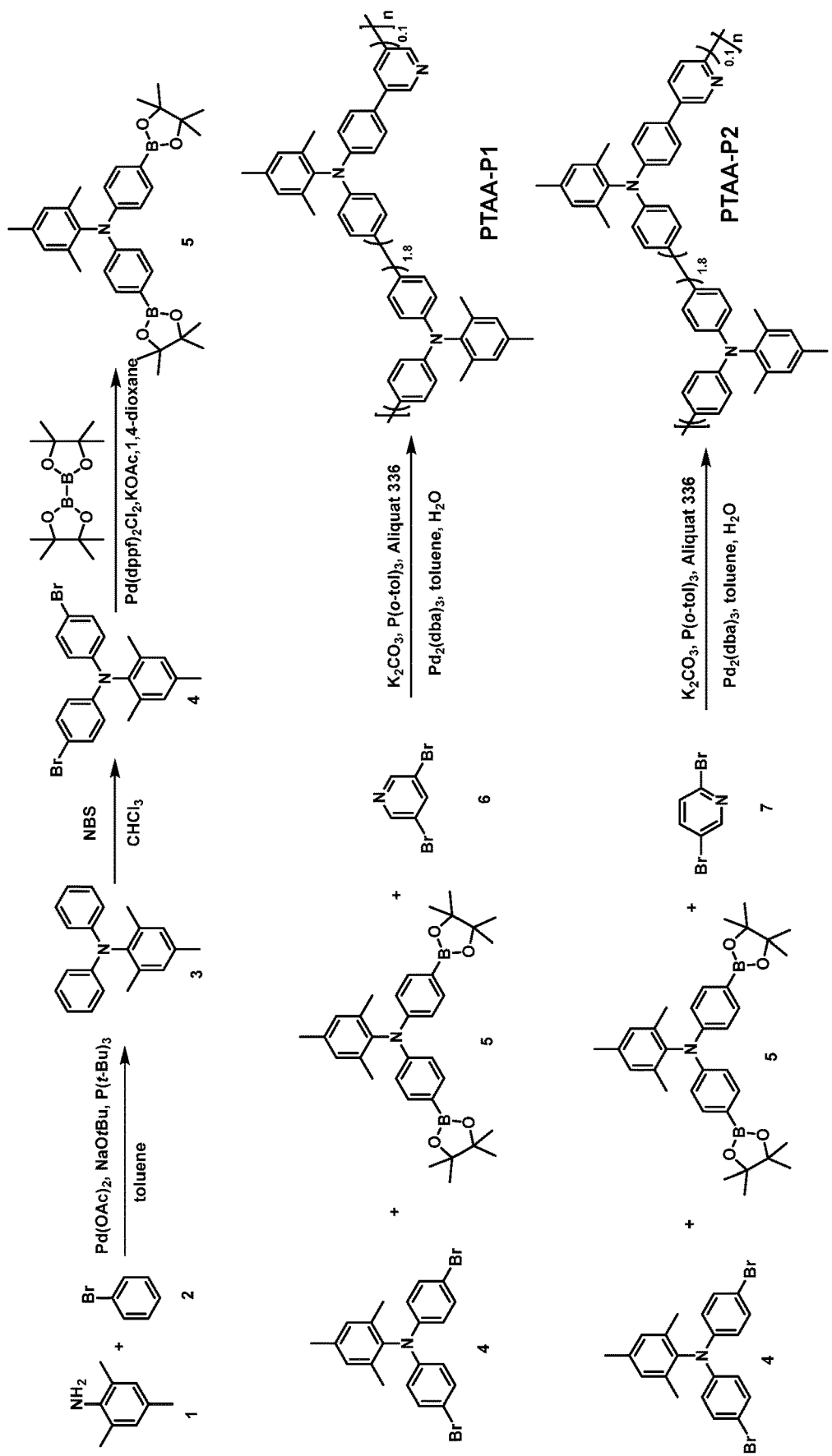
FIG. 1B is a synthetic route of PTAA-P1 and PTAA-P2.

FIG. 1B shows the synthetic route of PTAA-P1 (3,5-sites) and PTAA-P2 (2,5-site) obtained by changing the linkage sites of pyridine units. Compound 1 is 2,4,6-trimethylaniline, compound 2 is bromobenzene, compound 3 is 2,4,6-trimethyl-N,N-diphenylaniline, compound 4 is N,N-bis(4-bromophenyl)-2,4,6-trimethylaniline. Compound 5 is 2,4,6-trimethyl-N,N-bis(4-(4,4,5,5-tetramethyl-1,3,2-dioxaborolan-2-yl)phenyl)aniline, compound 6 is 3,5-dibromopyridine and compound 7 is 2,5-dibromopyridine.

Figure 2A:
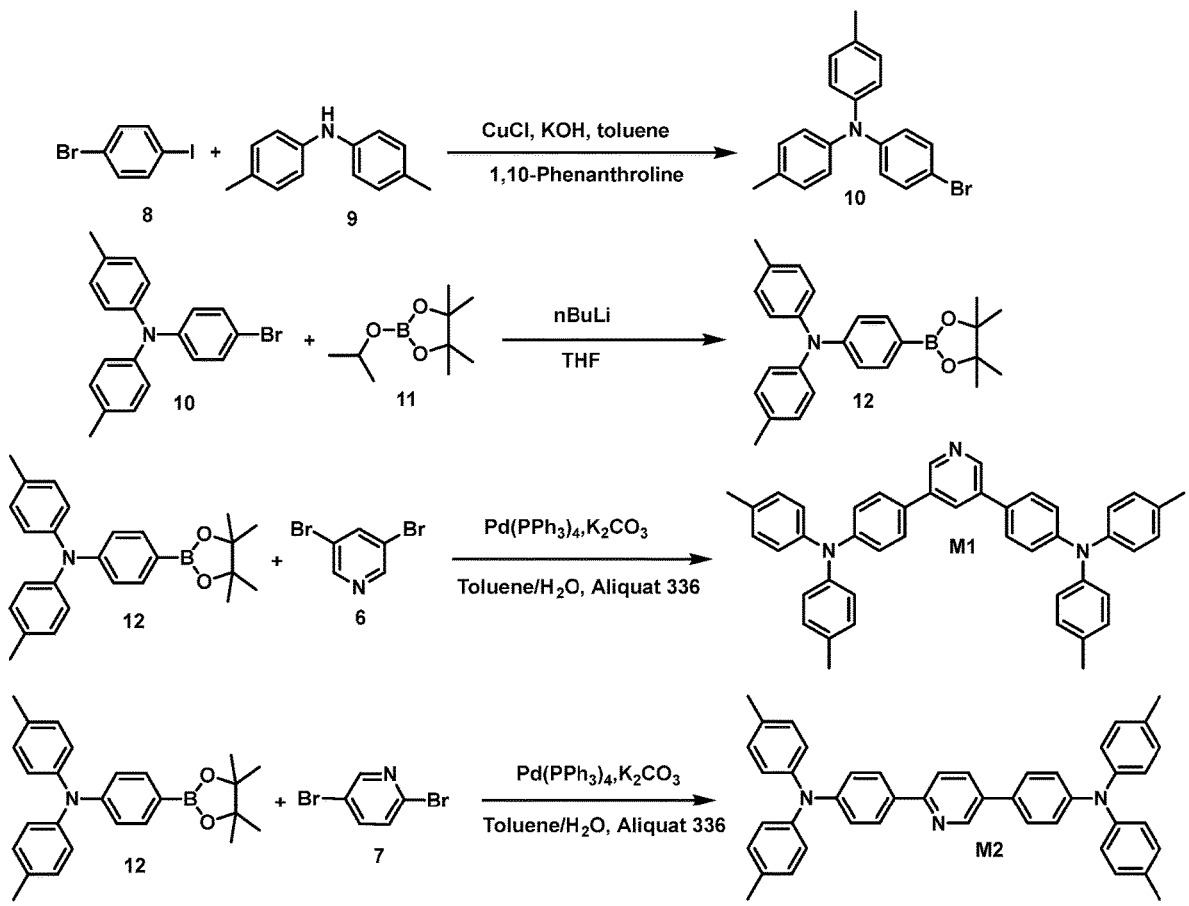
FIG. 2A shows a synthetic route of M1 and M2.

FIG. 2A gives the synthetic scheme of PTAA-P1's and PTAA-P2's monomers, M1 and M2.

Figure 2B:
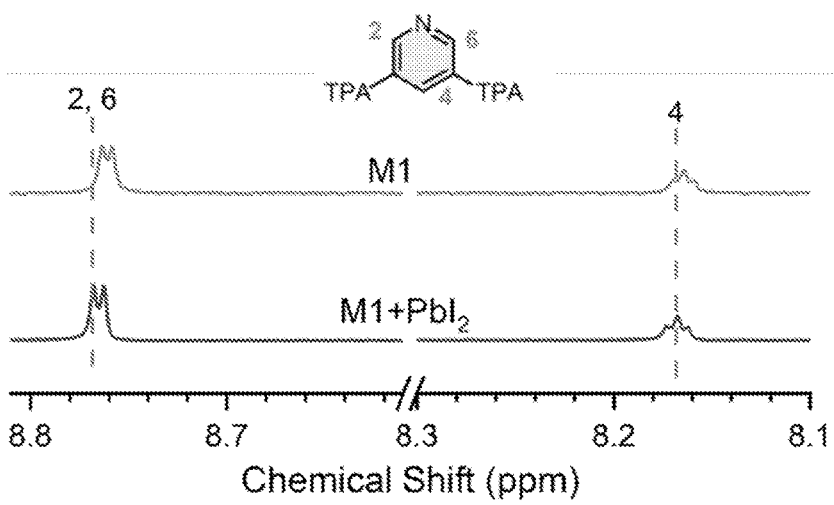
FIG. 2B shows the comparison of M1's 1H NMR spectra with and without mixing with $PbI_2$ in DMSO-d6.
Figure 2C:
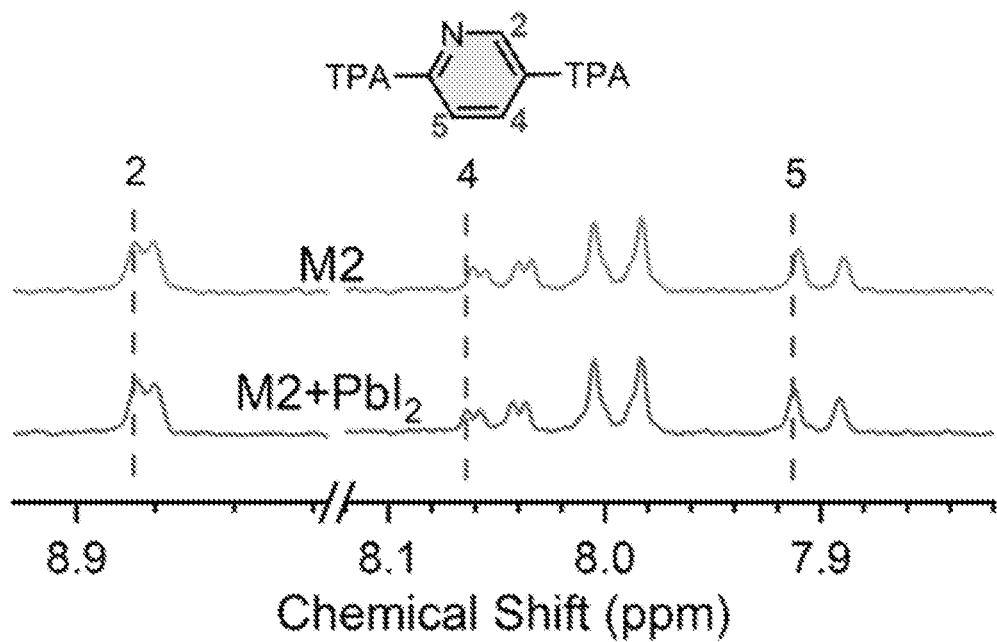
FIG. 2C shows the comparison of M2's 1H NMR spectra with and without mixing with $PbI_2$ in DMSO-d6.

FIGS. 2B and 2C compare the NMR spectra of the two monomers, M1 and M2, with and without Pb$^{2+}$. The protonic peaks assigned to the pyridine ring (between 7.9 ppm-8.9 ppm) in M1 and M2 all shift slightly to the low field after interacting with Pb$^{2+}$, where peaks in M1 shift more pronouncedly.

Figure 3A:
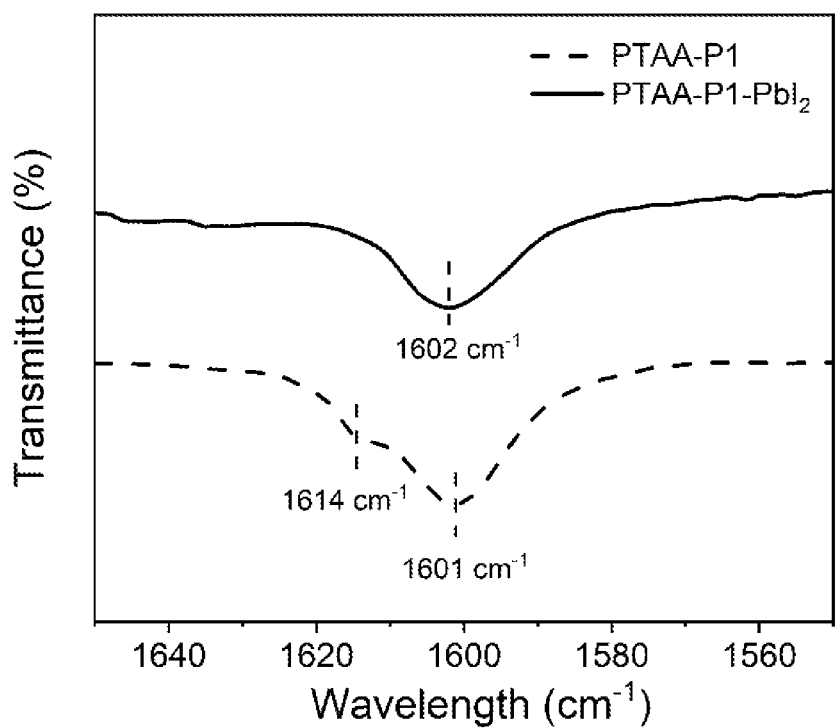
FIG. 3A shows FT-IR spectra in the region of the peak of the $v_{C=N}$ in PTAA-P1 film with and without $PbI_2$.
Figure 3B:
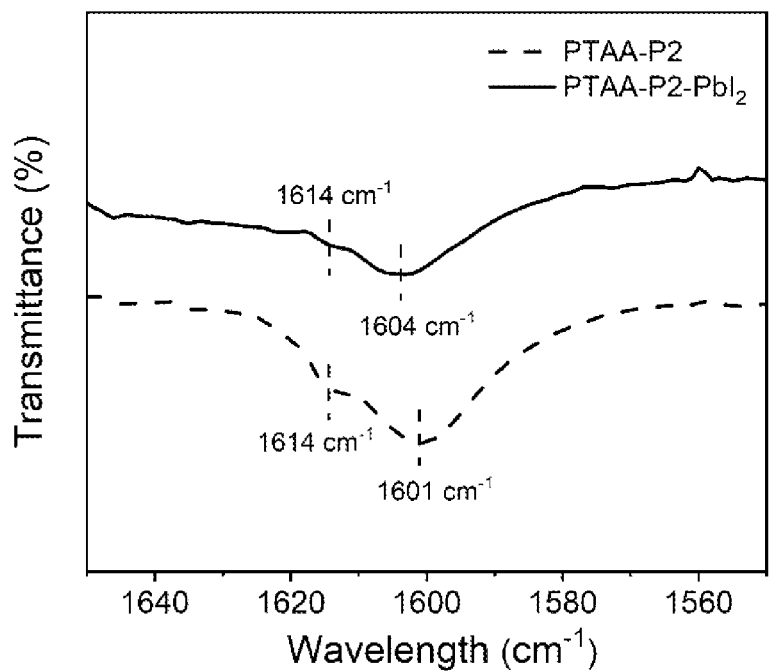
FIG. 3B shows FT-IR spectra in the region of the peak of the $v_{C=N}$ in PTAA-P2 film with and without $PbI_2$.

FIGS. 3A and 3B illustrate similar results as FIGS. 2B and 2C by FTIR spectra. The shifts of $v_{C=N}$ characteristic peak to a higher wavenumber for both PTAA-P1 (FIG. 3A, 1601 cm$^{-1}$ to 1602 cm$^{-1}$) and PTAA-P2 (FIG. 3B, 1601 cm$^{-1}$ to 1604 cm$^{-1}$) confirmed their strong interaction with Pb$^{2+}$.

Figure 4A:
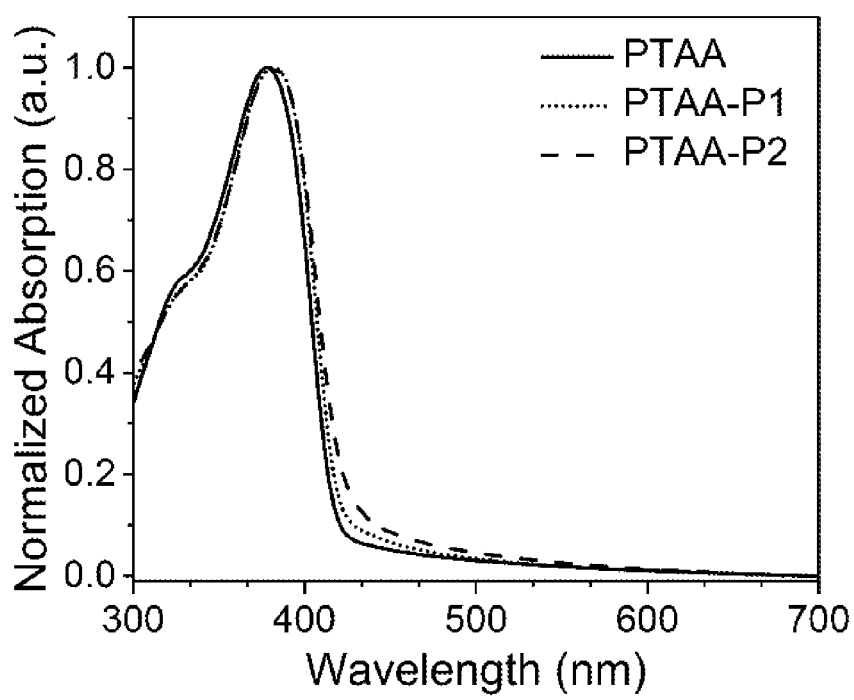
FIG. 4A is a graph showing normalized UV-vis absorption spectra of PTAA, PTAA-P1, and PTAA-P2 film.
Figure 4B:
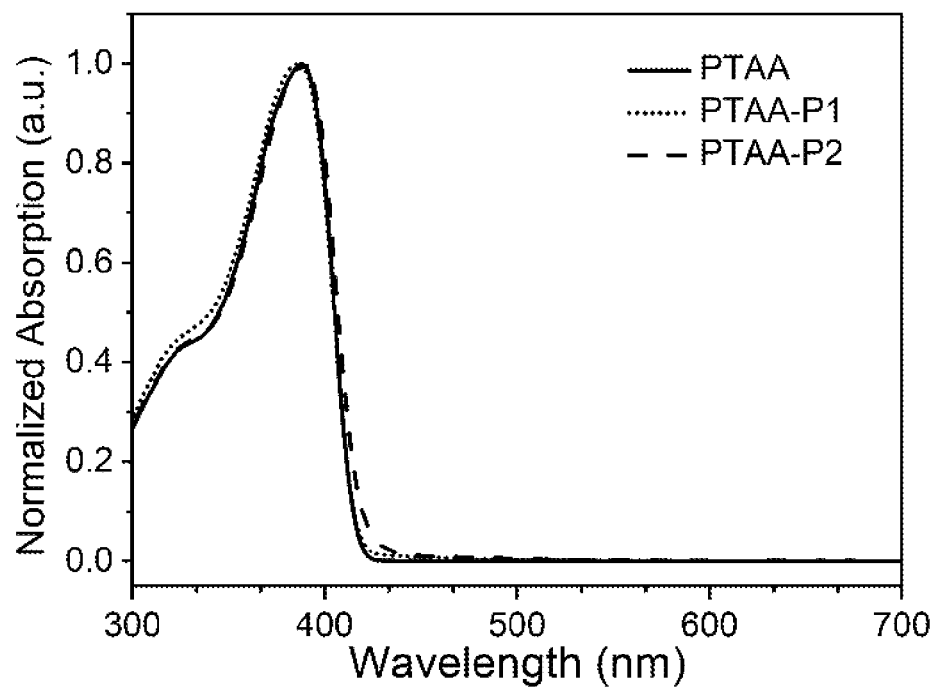
FIG. 4B is a graph showing normalized UV-vis absorption spectra of PTAA, PTAA-P1, and PTAA-P2 in DCM solution.

FIGS. 4A and 4B show the normalized UV-vis absorption spectra of PTAA, PTAA-P1, and PTAA-P2 in film and solution state respectively. The absorption curves of PTAA-P1 and PTAA-P2 are similar to PTAA, indicating the pyridine-linked PTAA doesn't obviously change the bandgap compared with PTAA.

Figure 5:
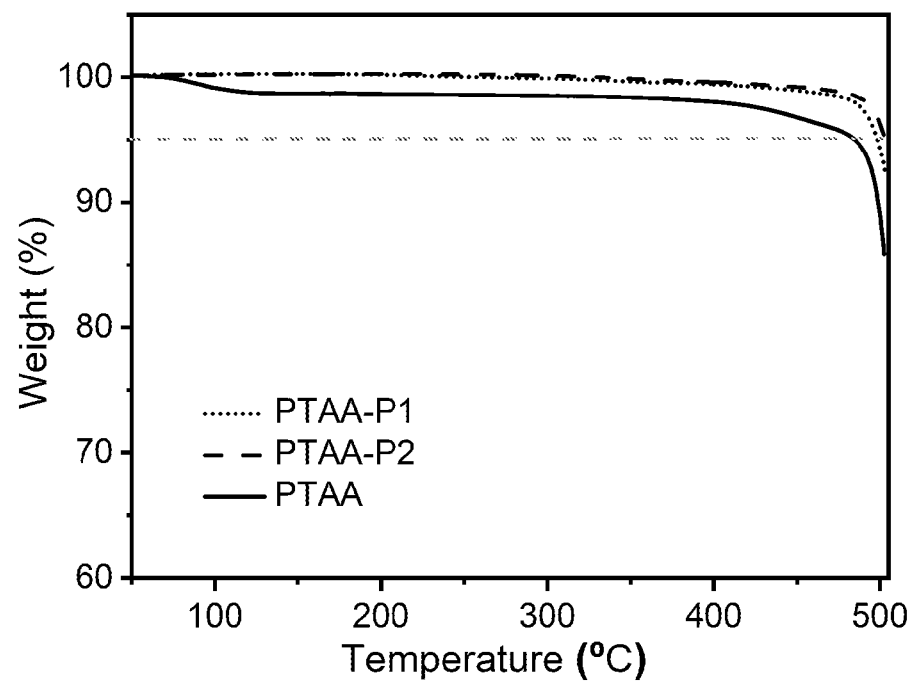
FIG. 5 is a graph showing TGA curves of PTAA, PTAA-P1 and PTAA-P2 under nitrogen with a heating rate of 10° C./min.

FIG. 5 shows that PTAA-P1 and PTAA-P2 exhibit slightly higher decomposition temperatures than PTAA, indicating their better thermal stability.

Figure 6:
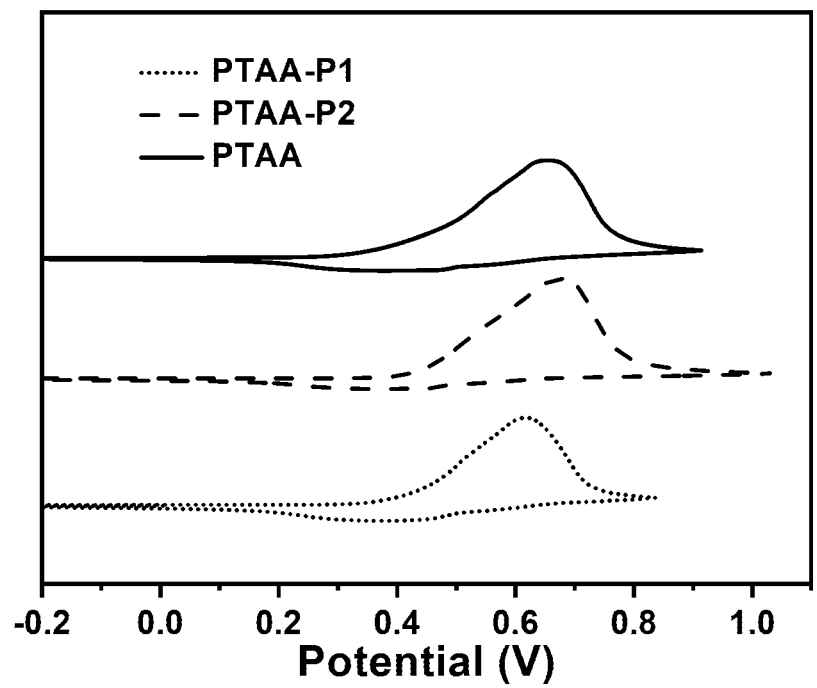
FIG. 6 is a graph showing the CV curves of polymer films versus Fc/Fc+(0.45 V) measured in $CH_3CN$ solutions.

FIG. 6 is a graph showing the highest occupied molecular orbital levels of PTAA-P1, PTAA-P2 and PTAA.

Figure 7:
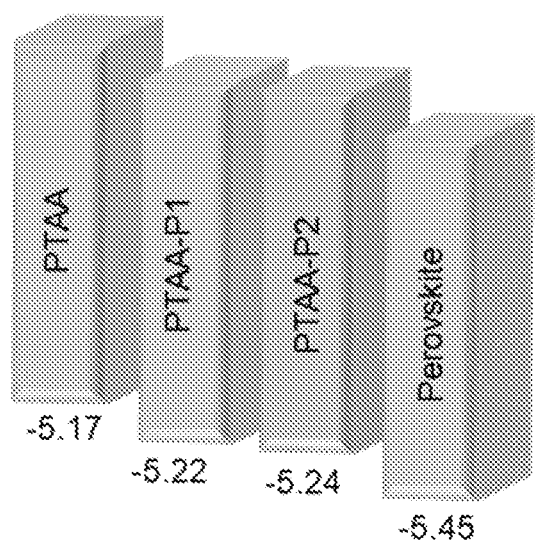
FIG. 7 shows an energy level diagram of perovskite with PTAA, PTAA-P1, and PTAA-P2.

FIG. 7 summarizes the calculation results of FIG. 6.

Figure 8A:
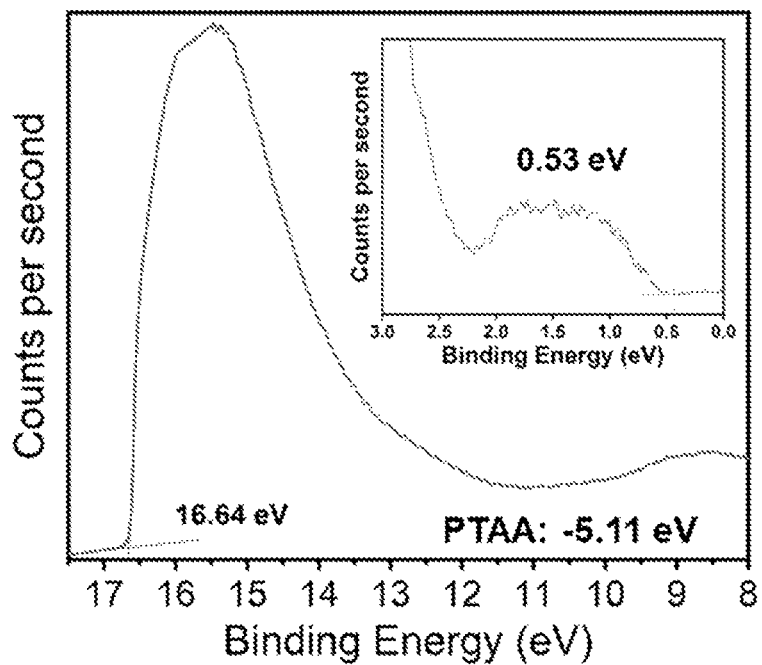
FIG. 8A shows a graph of the UPS spectrum of PTAA thin film.
Figure 8B:
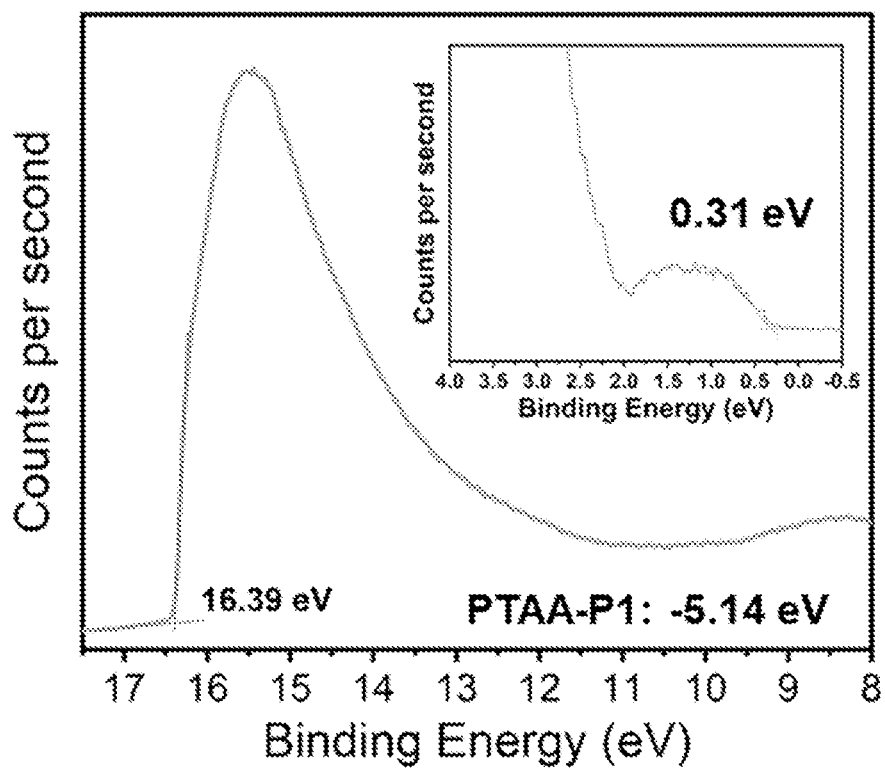
FIG. 8B shows a graph of the UPS spectrum of PTAA-P1 thin film.
Figure 8C:
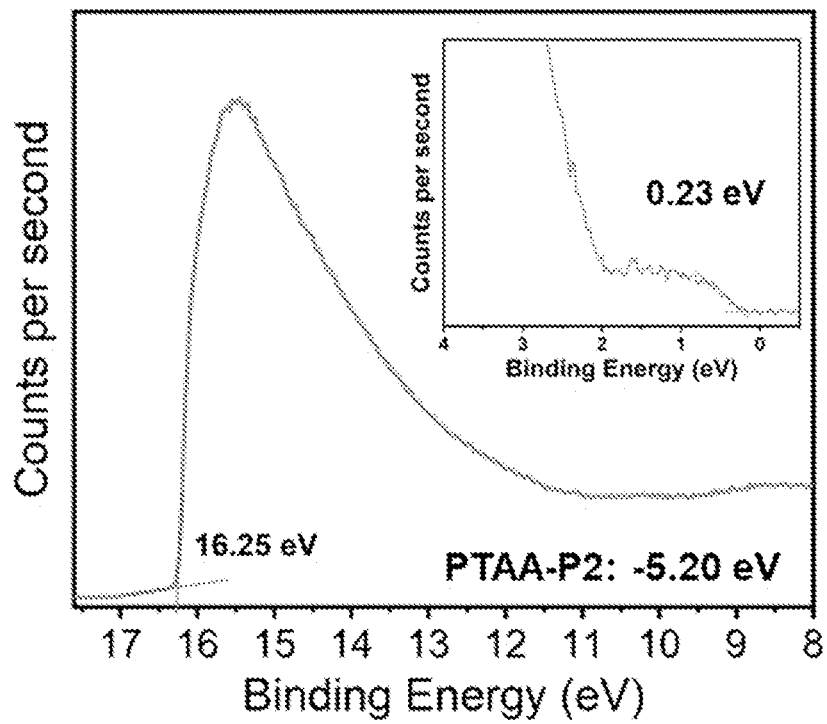
FIG. 8C shows a graph of the UPS spectrum of PTAA-P2 thin film.

FIG. 8A-8C provide another measurement of HOMO levels of PTAA-P1, PTAA-P2 and PTAA by UPS, respectively. These measurements confirm the deeper HOMO levels of PTAA-P1(−5.14 eV) and PTAA-P2 (−5.20 eV) than PTAA (−5.10 eV), which is beneficial for the interfacial charge transfer from perovskite to hole-transporting material.

Figure 9:
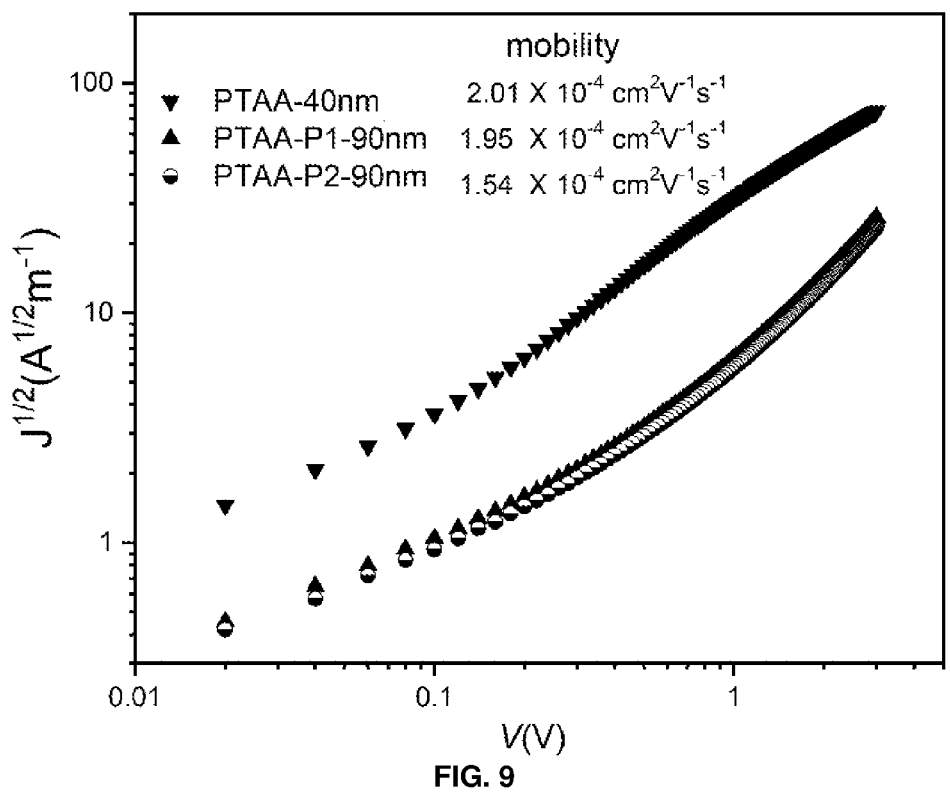
FIG. 9 is a graph showing the hole injection characteristics of PTAA, PTAA-P1 and PTAA-P2 measured by the SCLC method based on the device structure of ITO/PEDOT:PSS/HTM/$MoO_3$/Ag.

FIG. 9 shows the measurement of various embodiments' hole mobilities of PTAA, PTAA-P1 and PTAA-P2 by SCLC. It can be read that their hole mobilities are $2.01 \times 10^{-4}$ cm$^2$ V$^{-1}$ s$^{-1}$, $1.95 \times 10^{-4}$ cm$^2$ V$^{-1}$ s$^{-1}$ and $1.54 \times 10^{-4}$ cm$^2$ V$^{-1}$ s$^{-1}$, respectively. All of these embodiments meet the standard for dopant-free hole-transporting materials.

Figure 10A:
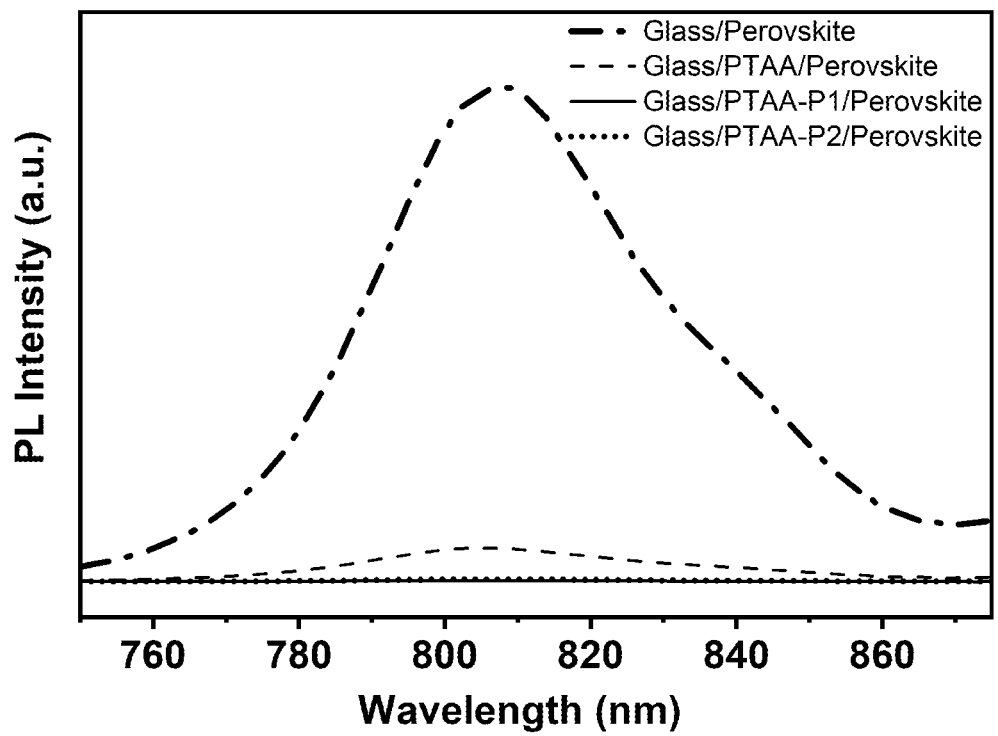
FIG. 10A is a graph showing steady-state photoluminescence (PL) spectrum of perovskite films on glass, glass/PTAA, glass/PTAA-P1, and glass/PTAA-P2 substrates, respectively.
Figure 10B:
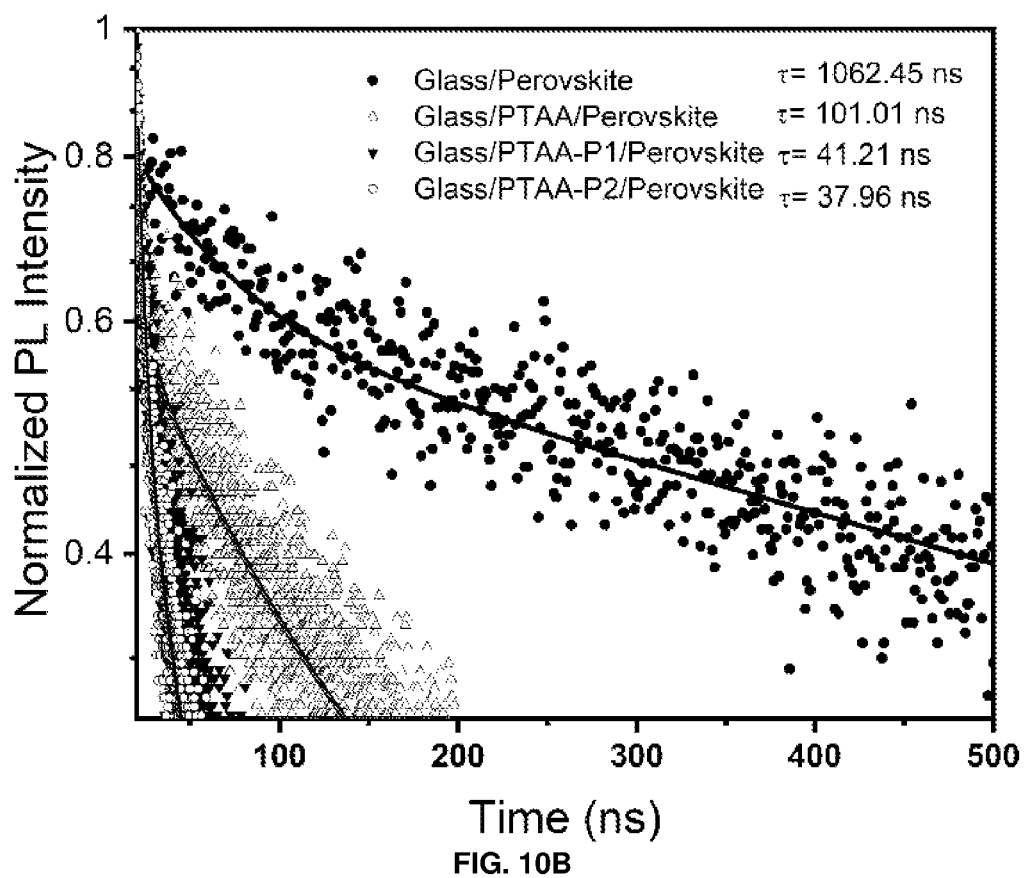
FIG. 10B is a graph showing the time-resolved photoluminescence spectra (TRPL) of perovskites deposited on glass, glass/PTAA, glass/PTAA-P1, and glass/PTAA-P2 substrates, respectively.

FIGS. 10A and 10B show the photoluminescence (PL) and time-resolved photoluminescence (TRPL) spectra of Glass/perovskite, Glass/PTAA/Perovskite, Glass/PTAA-P1/Perovskite, and Glass/PTAA-P2/Perovskite. The more significant PL quenching and shorter PL lifetime of Glass/PTAA-P1/Perovskite and Glass/PTAA-P2/Perovskite than Glass/PTAA/Perovskite in FIGS. 10A and 10B confirm the facilitated interfacial charge transfer of the former ones.

Figure 11A:
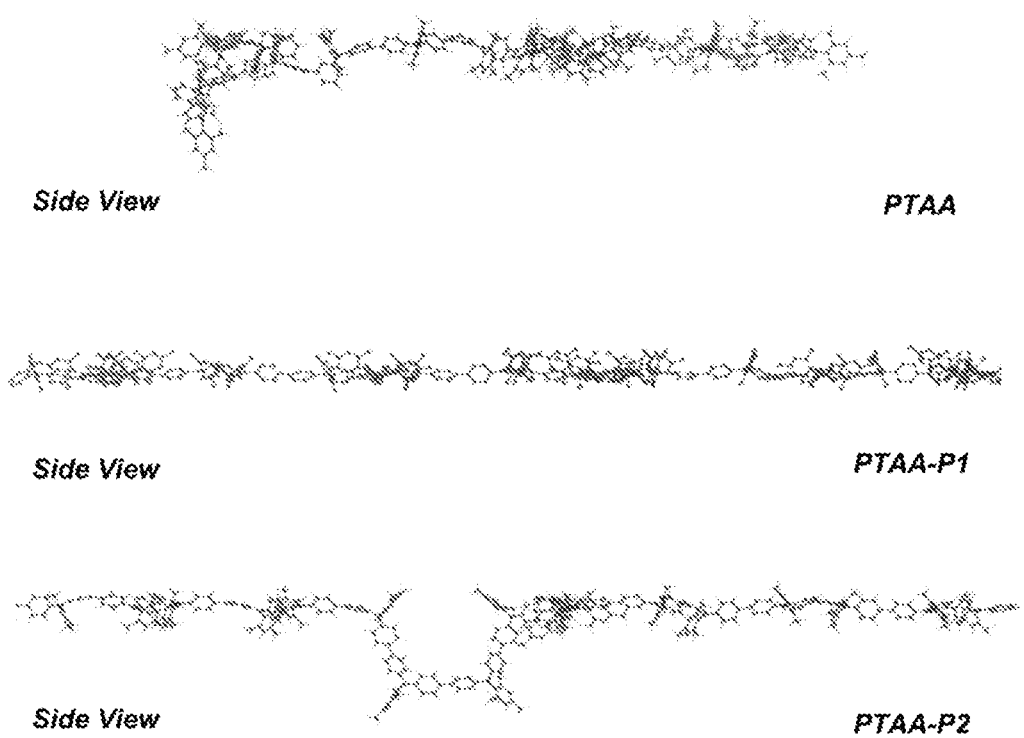
FIG. 11A shows the side views of DFT simulation results of the molecular conformation for PTAA, PTAAP1, and PTAA-P2 after interaction with perovskite.
Figure 11B:
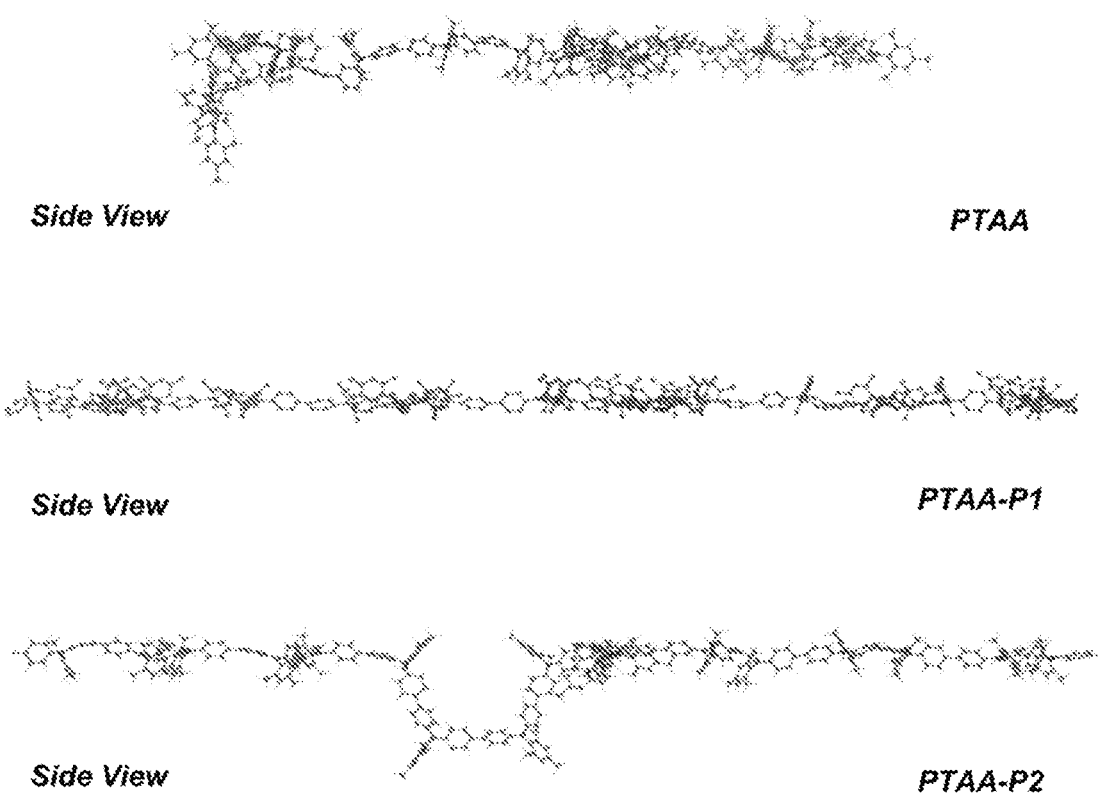
FIG. 11B shows the front views of DFT simulation results of stabilized molecule configuration of PTAA, PTAA-P1, and PTAA-P2 after interaction with perovskite.

FIGS. 11A and 11B show the side-view and front-view images of simulated structures of PTAA, PTAA-P1, and PTAA-P2 after interacting with perovskites. It is observed that PTAA-P1 has a more linear and regulated structure than PTAA and PTAA-P2, which is beneficial for the charge transfer at the interface.

Figure 12:
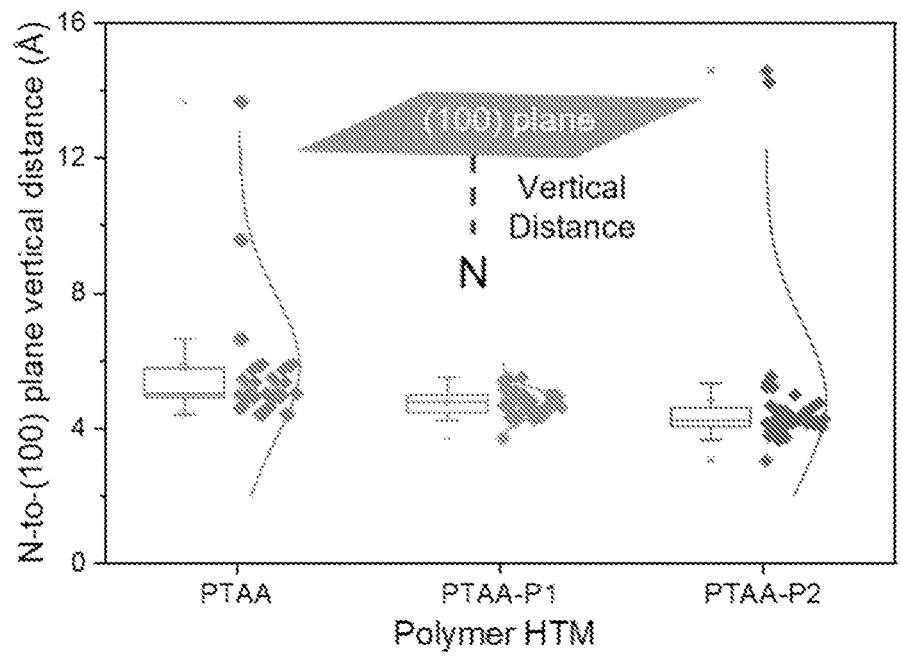
FIG. 12 shows statistical distribution of stabilized N-to-(100) plane vertical distance of PTAA, PTAA-P1, and PTAA-P2.

FIG. 12 analyzes the distance distribution between three hole transporting materials and the perovskite (100) plane. The distance distribution of PTAA and PTAA-P2 are broad, while that of PTAA-P1 is narrow, indicating a tougher interface formed by PTAA-P1 and perovskite.

Figure 13:
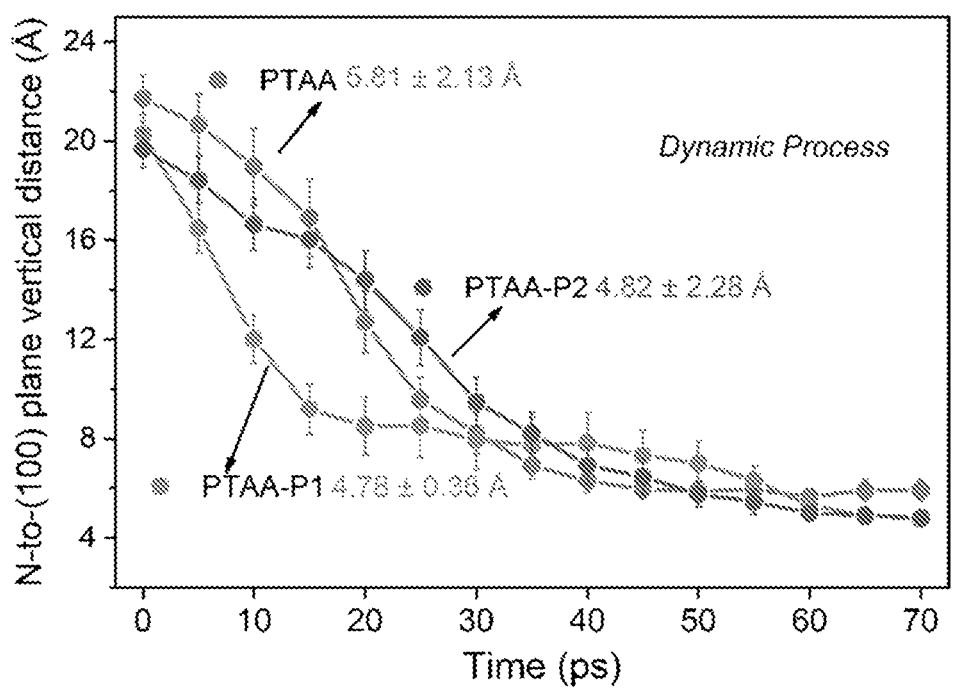
FIG. 13 shows N-to-(100) plane vertical distance evolution in different HTMs as a function of time.

FIG. 13 shows the quantified vertical distance of the three structures as a function of time, and PTAA-P1 is apparently more prompt to approach the (100) plane.

Figure 14A:
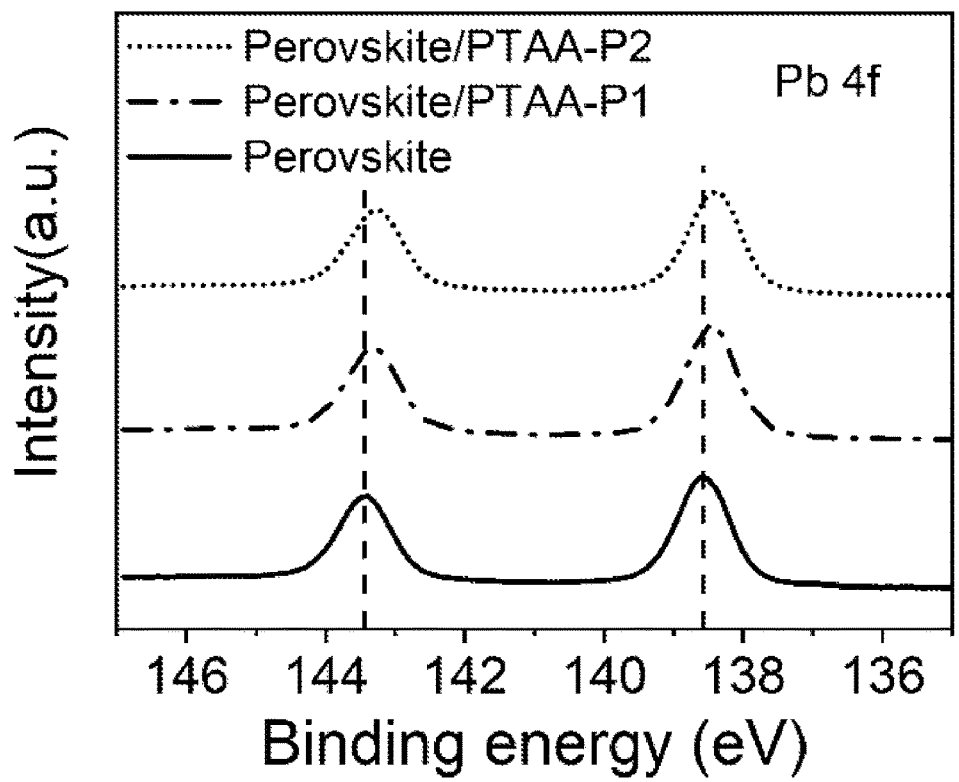
FIG. 14A is a graph showing XPS characterization of Pb element on pristine perovskite film and perovskite with synthesized HTMs.
Figure 14B:
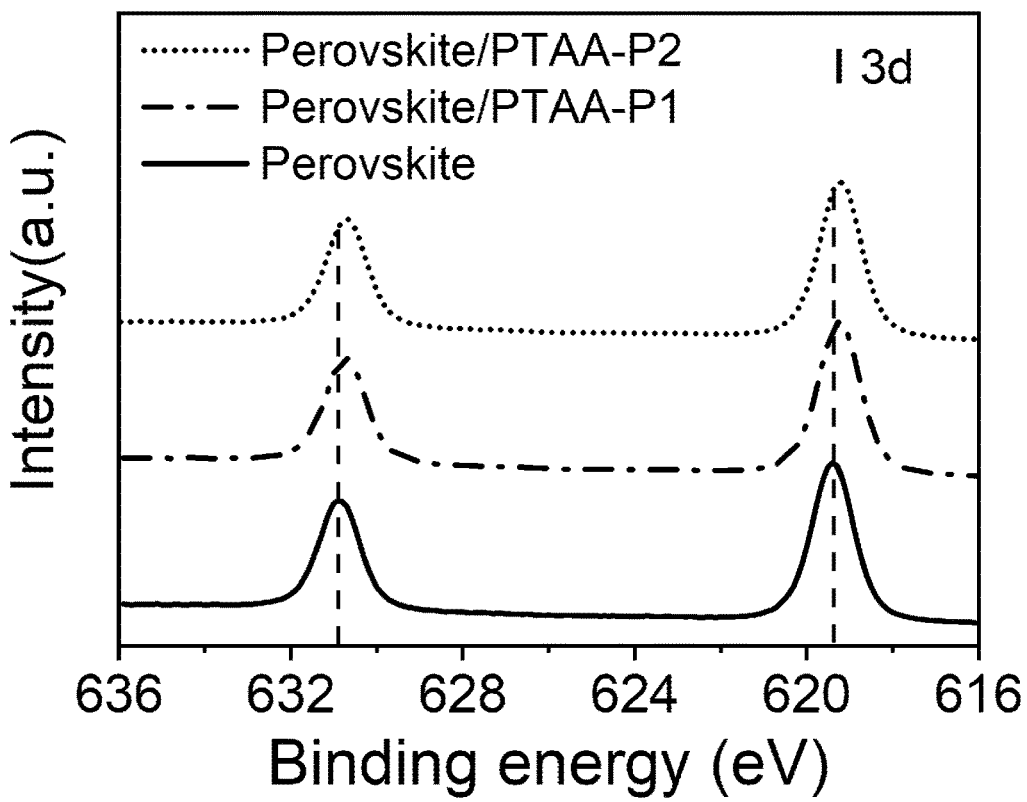
FIG. 14B is a graph showing XPS characterization of I element on pristine perovskite film and perovskite with synthesized HTMs.

FIGS. 14A and 14B collect X-ray photoelectron spectra and show the banding energy shifts of Pb and I elements in PTAA-P1- and PTAA-P2-covered perovskite films as compared with PTAA-based perovskites, confirming the stronger interaction between pyridine-coordinated HTMs and perovskite. The strengthened and regulated interfaces can promote the crystal growth of perovskite and enhance the stability of fabricated perovskite solar cells.

Figure 15A:
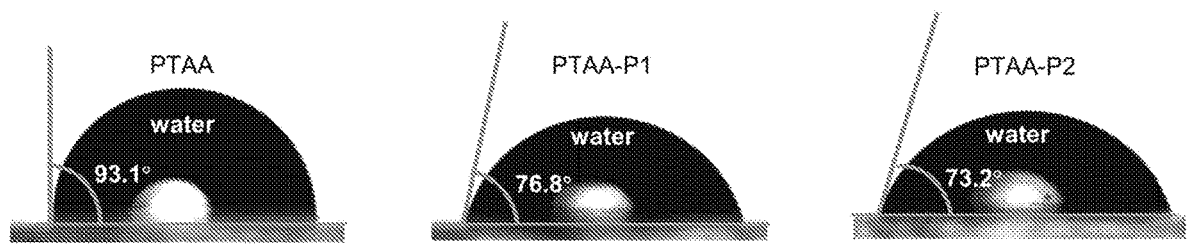
FIG. 15A shows contact angle measurements of different HTM films with respect to water drop.

FIGS. 15A and B shows that the water, DMF and perovskite precursor contact angles of PTAA-P1 and PTAA-P2 are smaller than that of PTAA, indicating PTAA-P1 and PTAA-P2 have strong wettability than PTAA. This is beneficial for the formation of fully covered perovskite films with high crystallinity on hole-transporting materials.

Figure 16A:
FIG. 16A shows cross-sectional scanning electron microscopy (SEM) images of perovskite films on different HTMs, scale bar: 1 μm.

SEM images in FIG. 16A show that the morphology of PTAA-P1 is smoother and has a better bottom contact than PTAA and PTAA-P2, which can promote the formation of ideal surface and bottom interfaces for charge transfer with suppressed non-radiative recombination.

Figure 16B:
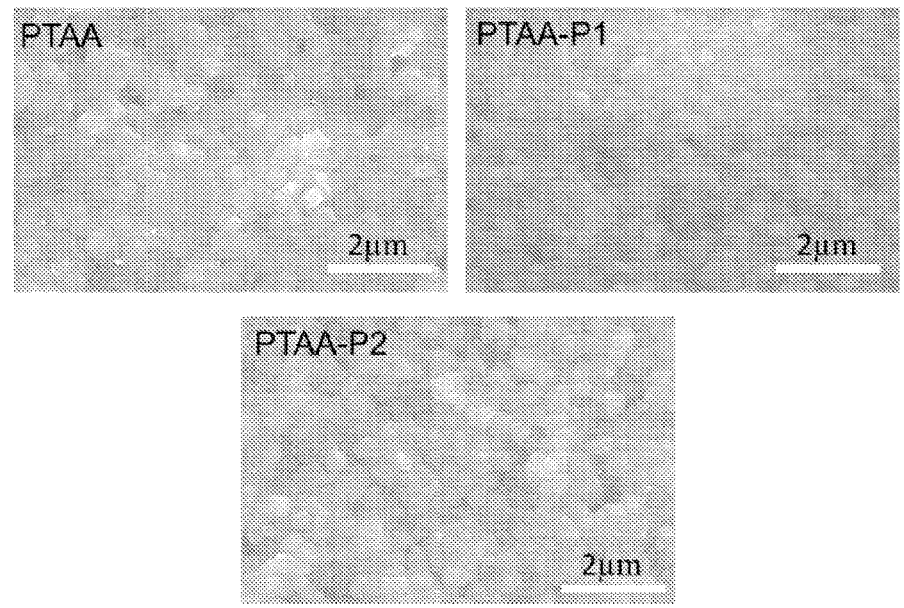
FIG. 16B shows top-view SEM images of perovskite films on PTAA, PTAA-P1, and PTAA-P2, respectively.

The result of FIG. 16A is further confirmed by FIG. 16B. FIG. 16B shows that perovskite films grown on PTAA-P1 possess smoother morphology and more uniform grain size than PTAA and PTAA-P2 with fewer pinholes.

Figure 17:
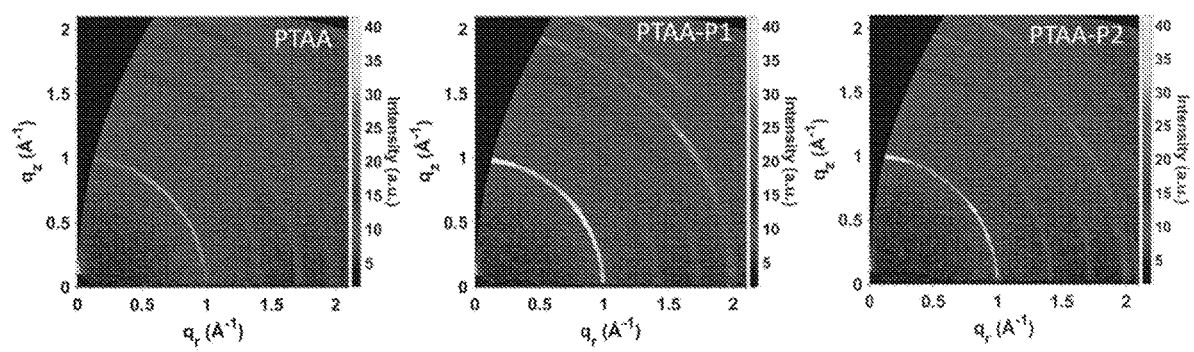
FIG. 17 shows GIWAXS patterns for perovskite films prepared on different HTMs.

FIG. 17 compares the GIWAXS measurements of the three structures and shows that PTAAP1-based perovskite films exhibit obviously brighter diffraction rings of these two planes than those of the PTAA- and PTAA-P2-based films.

Figure 18:
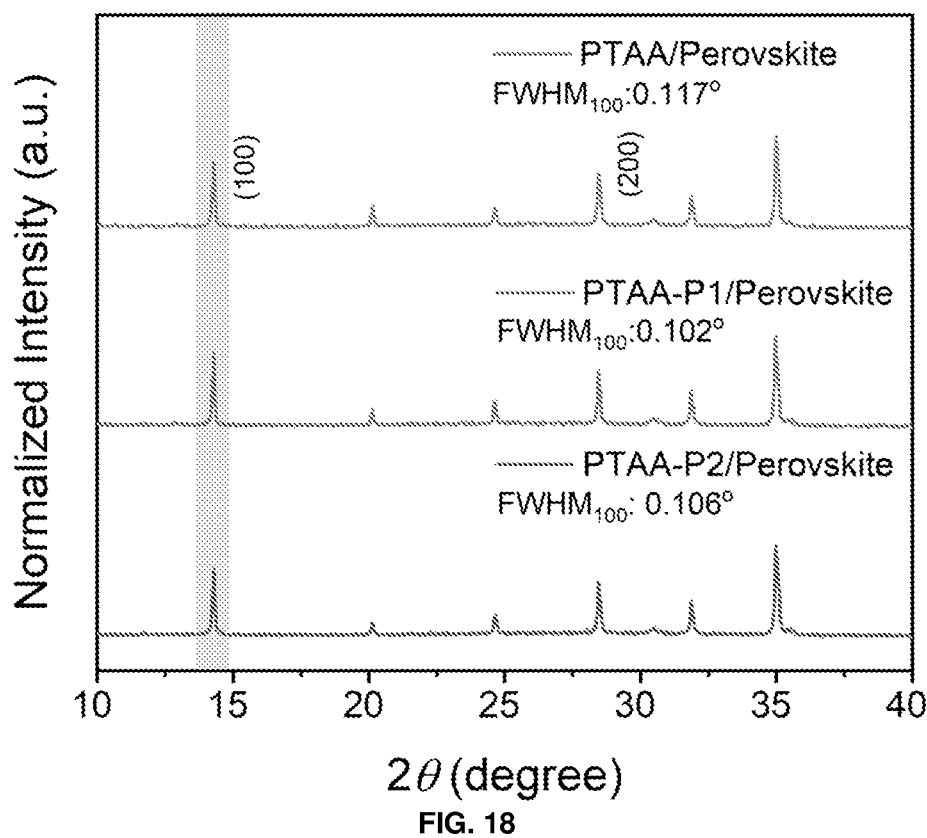
FIG. 18 shows XRD patterns of perovskite on PTAA, PTAA-P1, and PTAA-P2, respectively.

FIG. 18 shows that perovskite grown on PTAA-P1 exhibits higher diffraction intensity with decreased full-width at half-maximum (FWHM) compared to PTAA and PTAA-P2, indicating an enhanced crystallinity.

Figure 19:
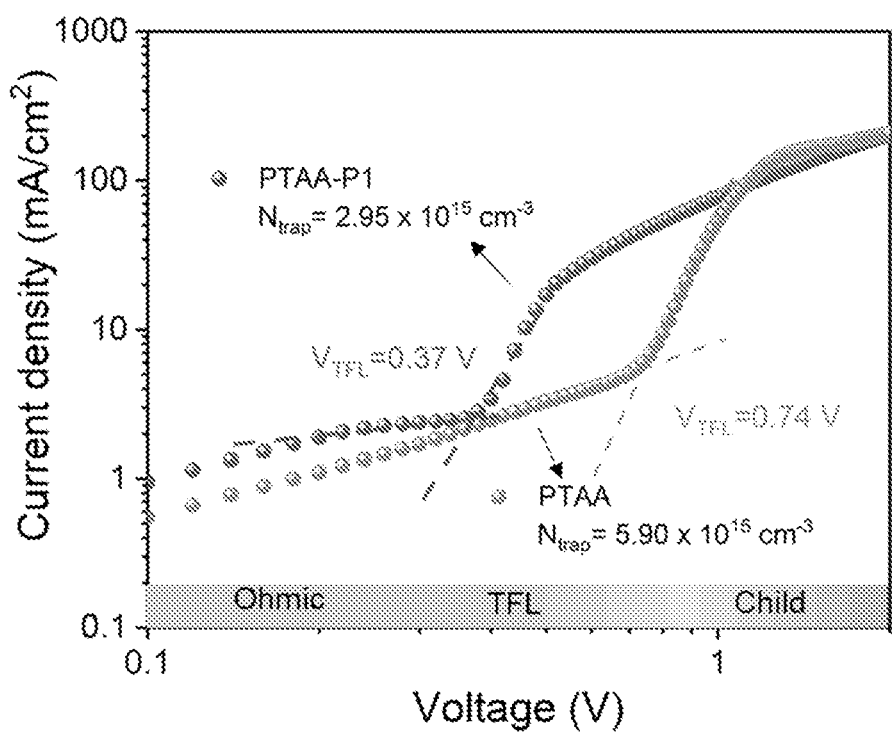
FIG. 19 is a graph showing SCLC curves and corresponding defect density of hole-only devices for perovskites grown on PTAA and PTAA-P1, respectively.

FIG. 19 compares the defect densities of perovskite films grown on PTAA-P1 and PTAA. The defect density of PTAA is $5.90 \times 10^{15}$ cm$^3$ and PTAA-P1 reduces to $2.95 \times 10^{15}$ cm$^{-3}$.

Figure 20A:
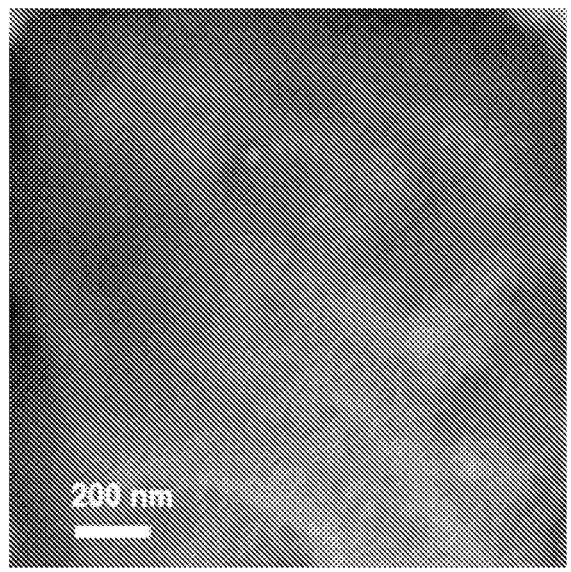
FIG. 20A is an image showing the bright-field transmission electron microscopy (TEM) of perovskites deposited on PTAA-P1.

FIG. 20A is a TEM image showing no defect on PTAA-P1-based perovskites.

Figure 20B:
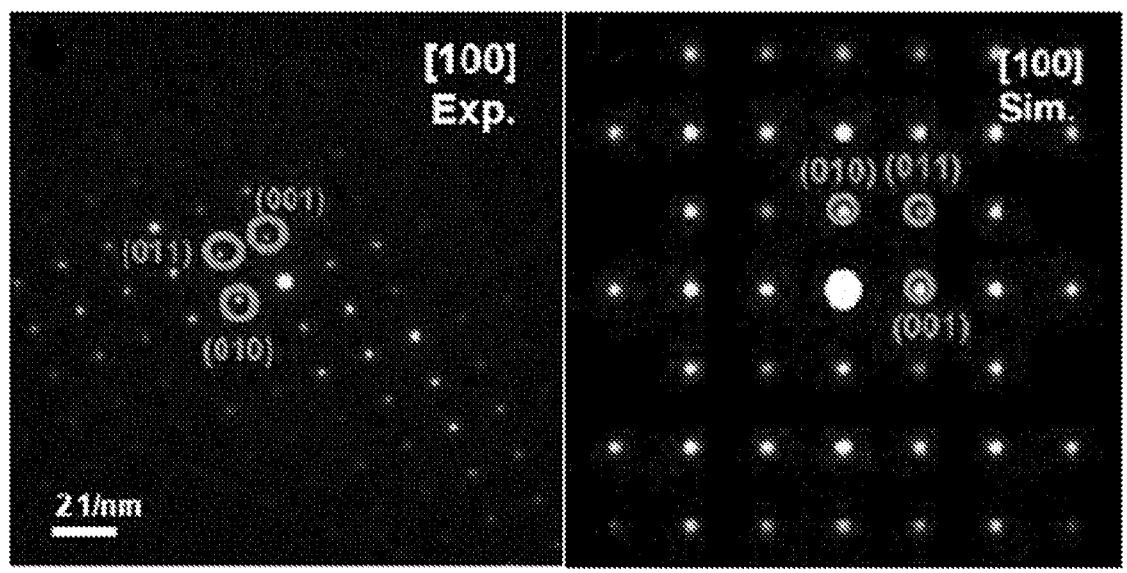
FIG. 20B shows (left) the experimentally measured SAED patterns of FIG. 20A and (right) a simulation of the diffraction pattern (DP) along [100] and [110].

FIG. 20B confirms that SAED patterns along [100] zone axis of the PTAA-P1-based perovskite in FIG. 20A exhibits identical features with the simulated diffraction intrinsic model.

Figure 20C:
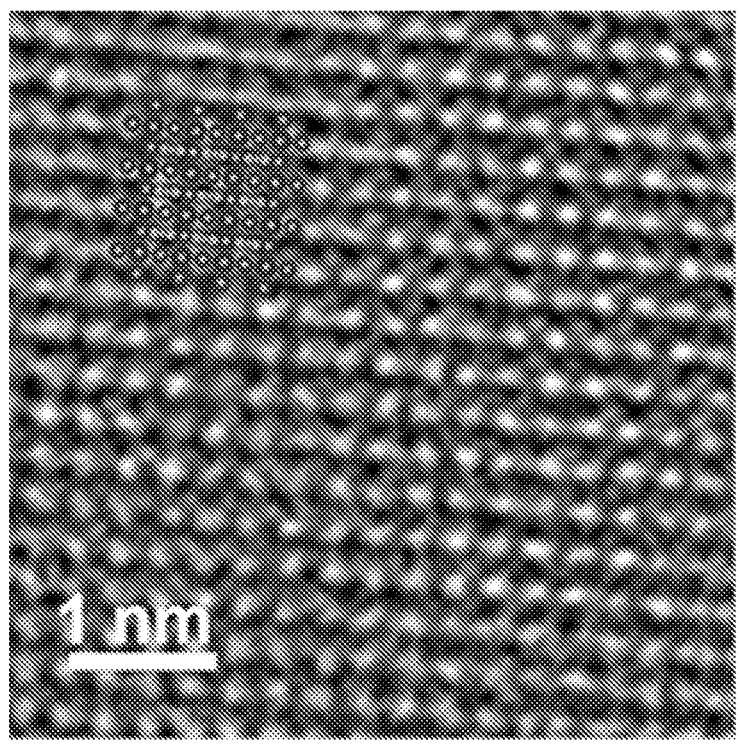
FIG. 20C is the HRTEM image of perovskites deposited on PTAA-P1.

FIG. 20C also depicts the atomic arrangement of perovskites deposited on PTAA-P1 is uniform with FAPbI$_3$ perovskite.

Figure 21A:
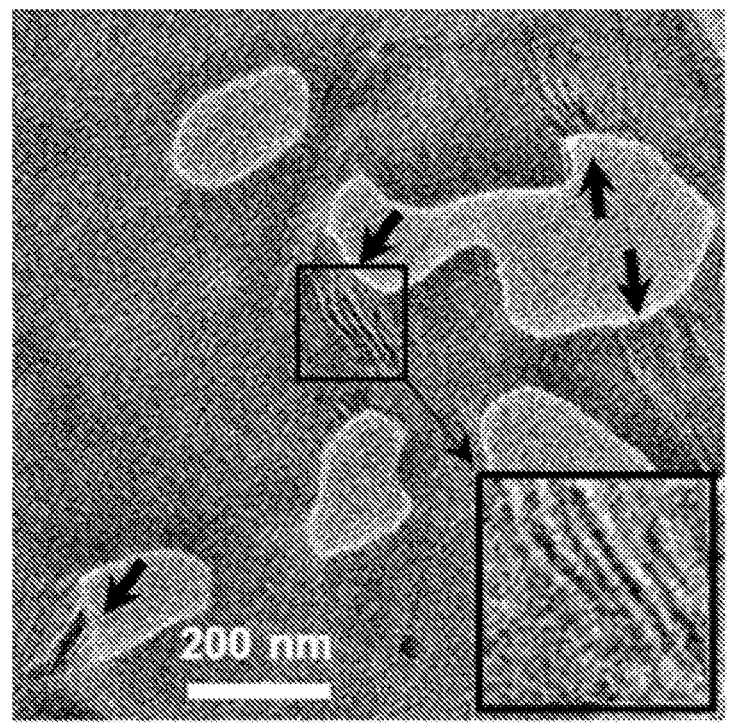
FIG. 21A is a bright-field TEM image of perovskites deposited on PTAA.

FIG. 21A shows bold black arrows indicating a high density of fringes of perovskites deposited on PTAA.

Figure 21B:
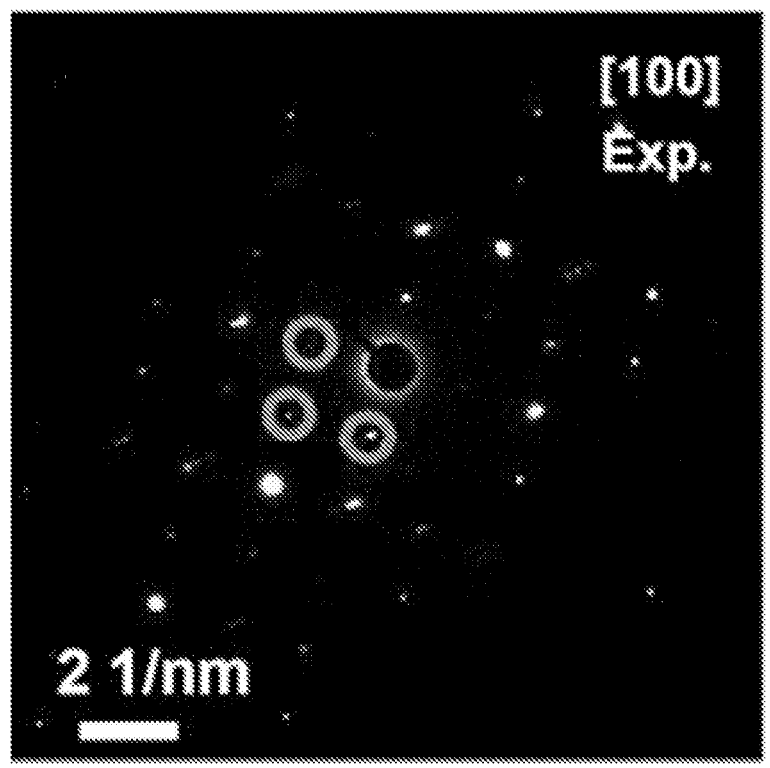
FIG. 21B shows SAED patterns of FIG. 21A.

FIG. 21B is the SAED pattern of FIG. 21A.

Figure 21C:
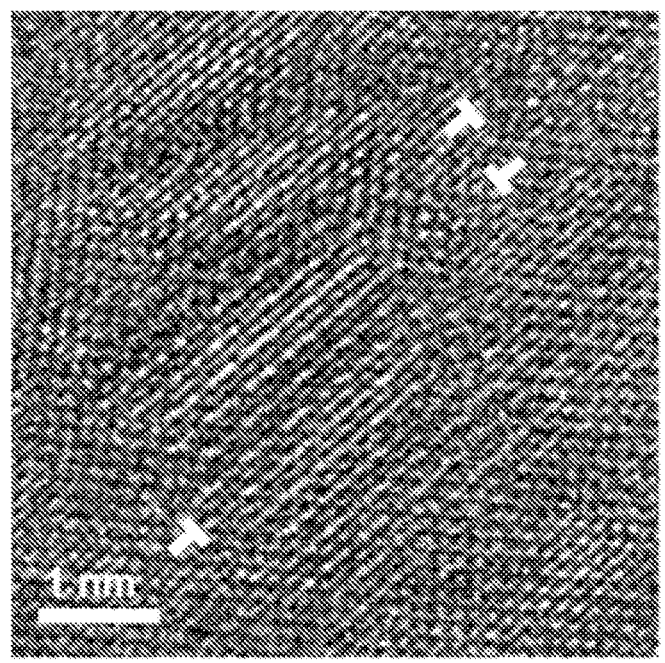
FIG. 21C is an HRTEM image of perovskites deposited on PTAA.

FIG. 21C shows T marks which are high density of edge dislocations of perovskites deposited on PTAA.

Figure 21D:
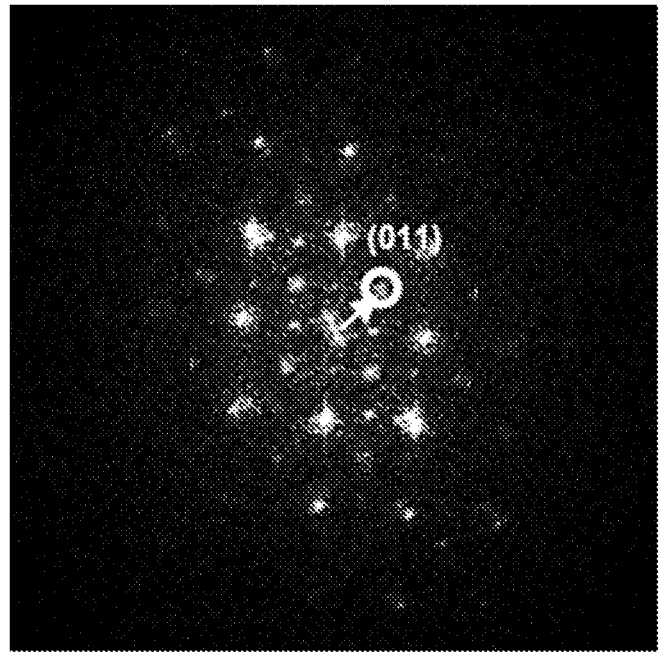
FIG. 21D is an image showing the Fast Fourier transform (FFT) of FIG. 21C.
Figure 21E:
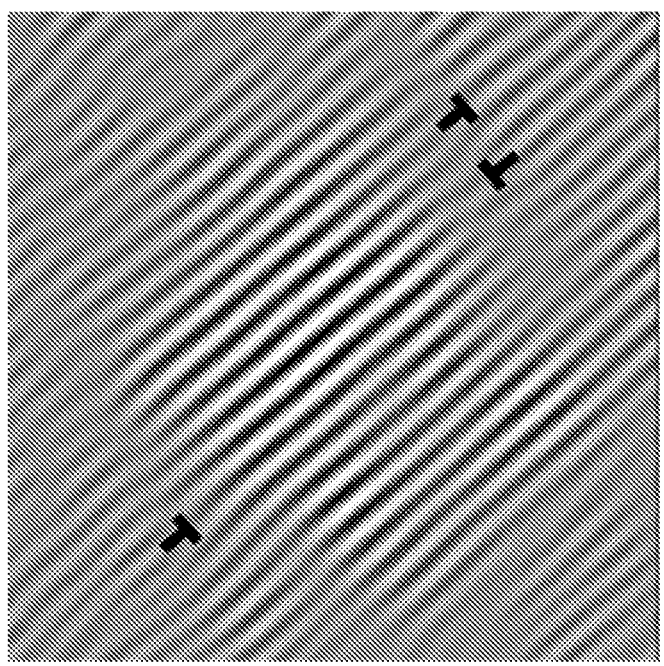
FIG. 21E is an image showing the Inverse Fast Fourier transform (IFFT) of FIG. 21C along [011].

FIGS. 21D and 21E also confirm the defect density in perovskites deposited on PTAA.

These results indicate perovskite grown on PTAA-P1 has a high defect density of fringes that could cause severe non-radiative recombination and impact device performance.

Figure 22:
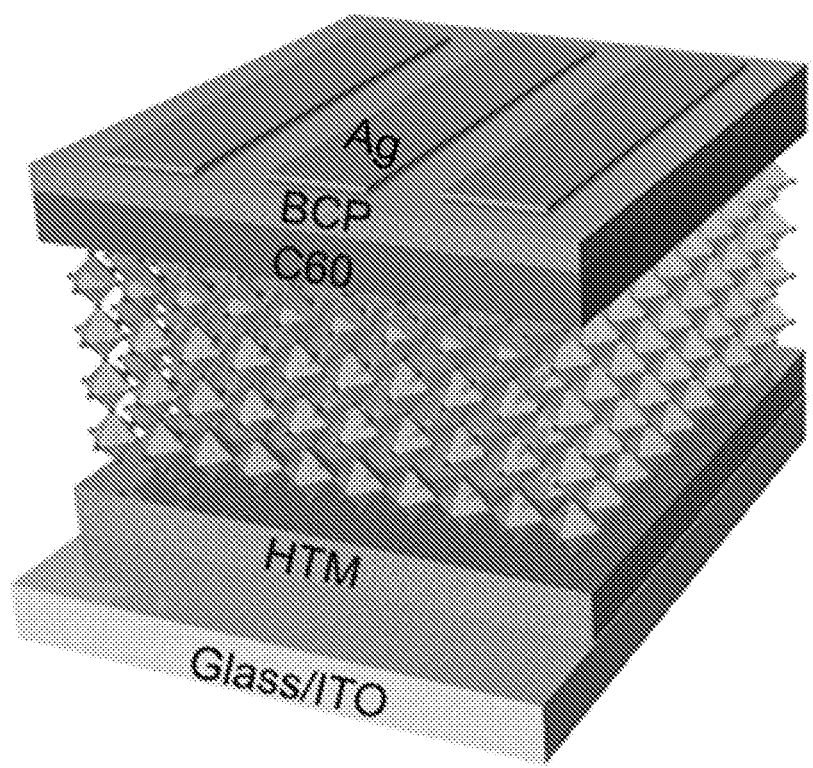
FIG. 22 is a model of the device configuration of fabricated inverted perovskite solar cells.

FIG. 22 shows a structure of fabricated inverted perovskite solar cells in which the layers are, from the bottom to the top, glass/ITO, HTM, perovskite, C$_{60}$, bathocuproine and Ag.

Figure 23A:
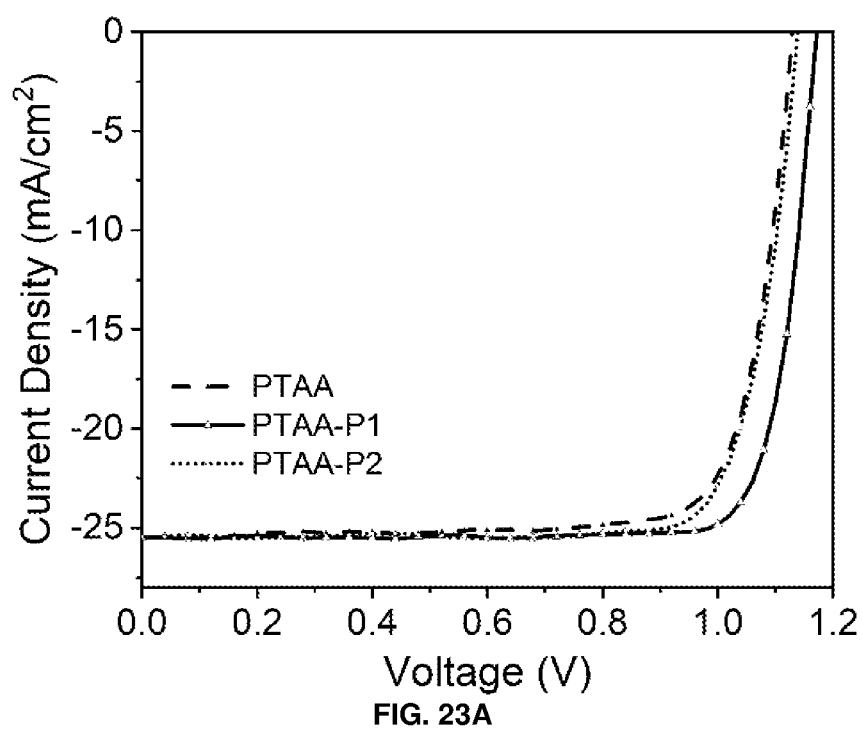
FIG. 23A is a graph showing J-V curves of champion PVSCs at reverse scan. Device area: 0.0809 $cm^2$.

FIG. 23A shows the parameters of champion PVSCs. The curves of PTAA and PTAA-P2 are close, while PTAA-P1 shows significantly better performance, especially for the open-circuit voltage (V$_{OC}$) and fill factor (FF).

Figure 23B:
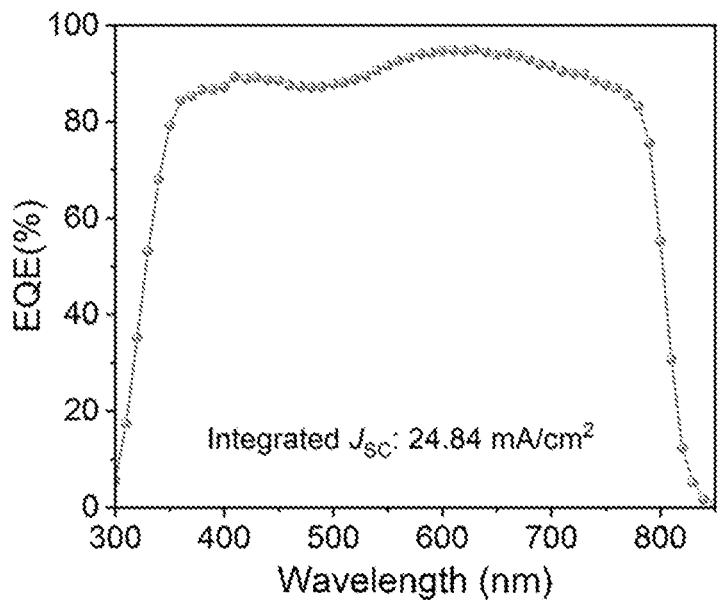
FIG. 23B is a graph showing the EQE spectra of champion devices based on PTAA-P1.

FIG. 23B's result of the integrated current density of the PTAA-P1-based champion device is in good agreement with the result of FIG. 23A.

Figure 24:
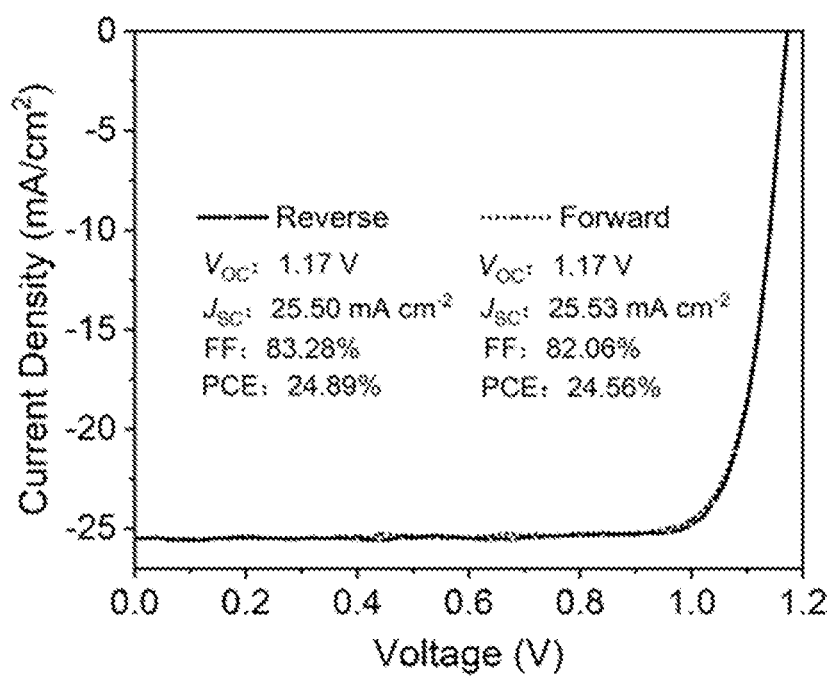
FIG. 24 is a graph showing J-V curves of champion devices from reverse and forward scans.

FIG. 24 illustrates the reverse and forward scan curves of the champion PTAA-P1-based device, which shows negligible hysteresis, indicating good validity of the device performance.

Figure 25A:
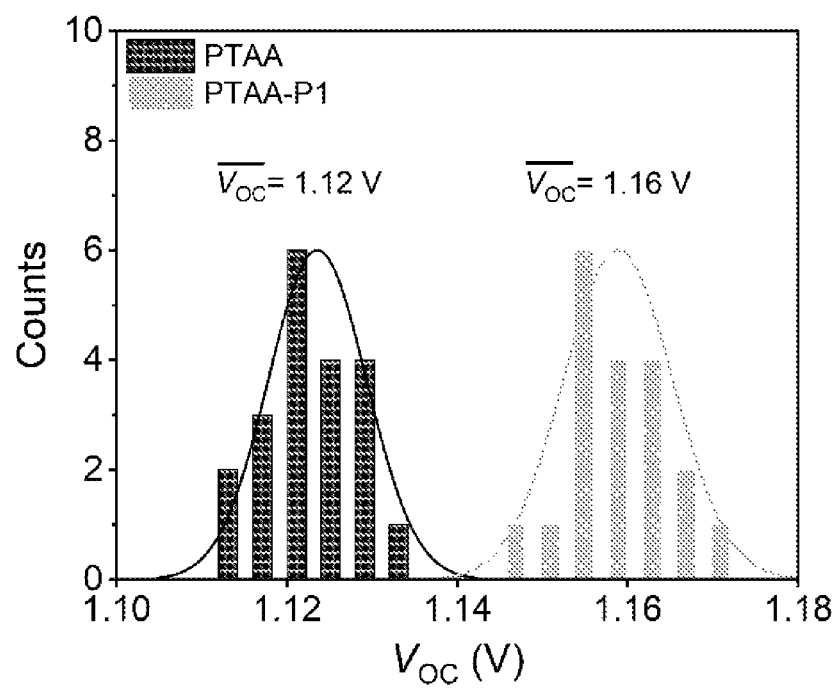
FIG. 25A is a graph showing a histogram of the $V_{OC}$ values among 20 small-area devices with PTAA and PTAA-P1 as HTMs, respectively. Device area: 0.0809 $cm^2$.

FIG. 25A shows the average V$_{OCS}$ of PTAA and PTAA-P1-based devices, which are 1.12 V and 1.16 V, respectively.

Figure 25B:
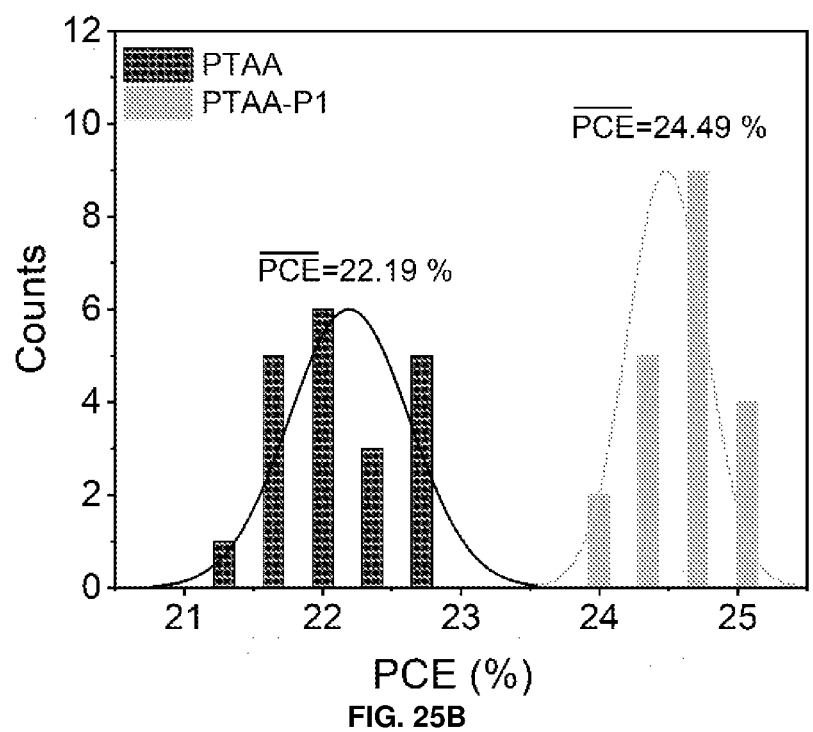
FIG. 25B is a graph showing a histogram of the PCE among 20 small-area devices with PTAA and PTAA-P1 as HTMs, respectively. Device area: 0.0809 $cm^2$.

FIG. 25B shows the average PCEs of PTAA and PTAA-P1-based devices, which are 22.19% and 24.49%, respectively.

Figure 25C:
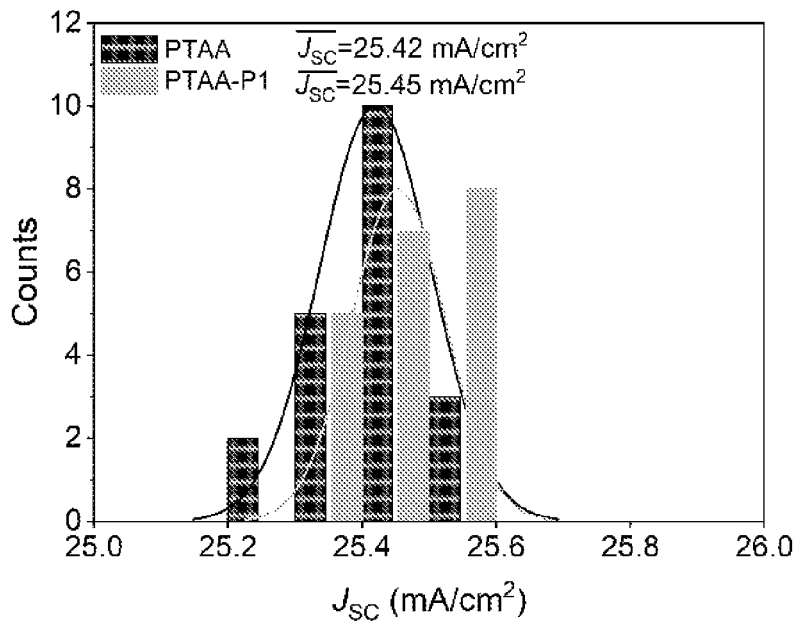
FIG. 25C is a graph showing a histogram of the $J_{SC}$ values among 20 devices with PTAA and PTAA-P1 as HTM, respectively.

FIG. 25C shows the average J$_{SCS}$ of PTAA and PTAA-P1-based devices, which are 25.42 and 25.45 mA/cm$^{2t}$ respectively.

Figure 25D:
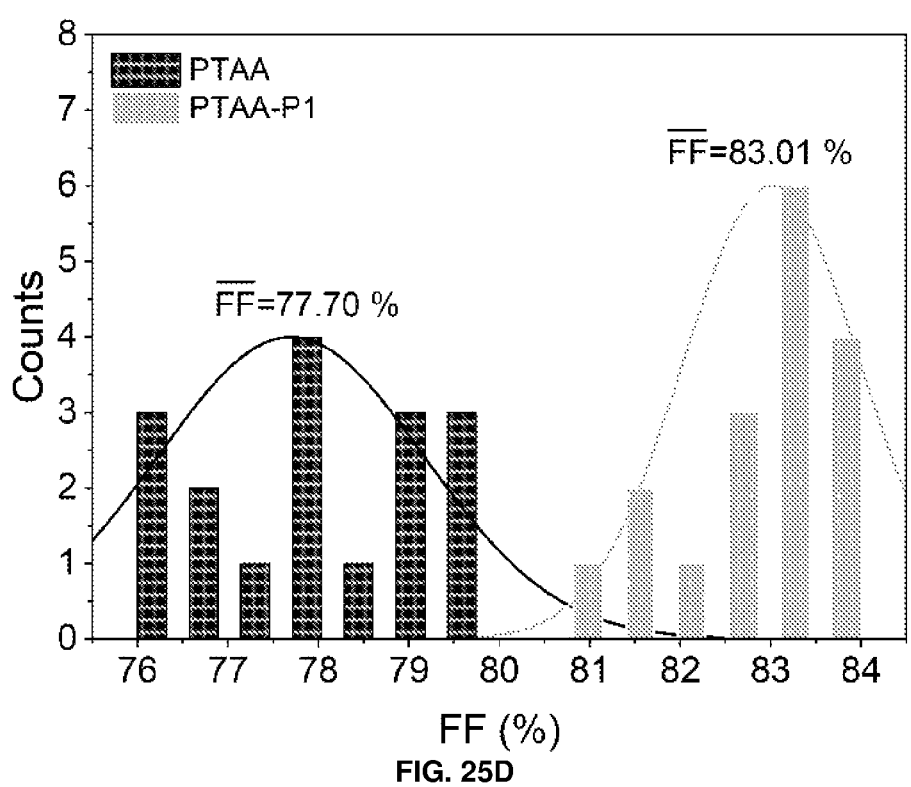
FIG. 25D is a graph showing a histogram of the FF values among 20 devices with PTAA and PTAA-P1 as HTM, respectively.

FIG. 25D shows the average FF % s of PTAA and PTAA-P1-based devices, which are 77.70% and 83.01%, respectively. These results in FIGS. 25A-25D imply that PTAA-P1 could reproducibly and effectively enhance the device performance in comparison with PTAA.

Figure 26:
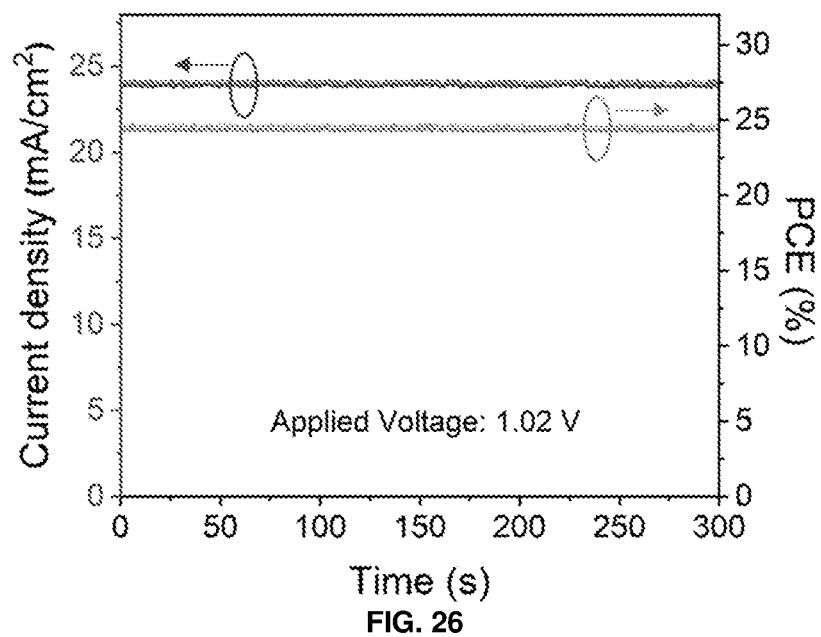
FIG. 26 is a graph showing the stabilized power output at the maximum power point (MPP) for PTAA-P1-based champion devices.

FIG. 26 shows an evaluation of champion devices at MPP under 1.02 V, showing a stabilized power output of 24.44% for 300 s, indicating the good stability and validity of device performance.

Figure 27:
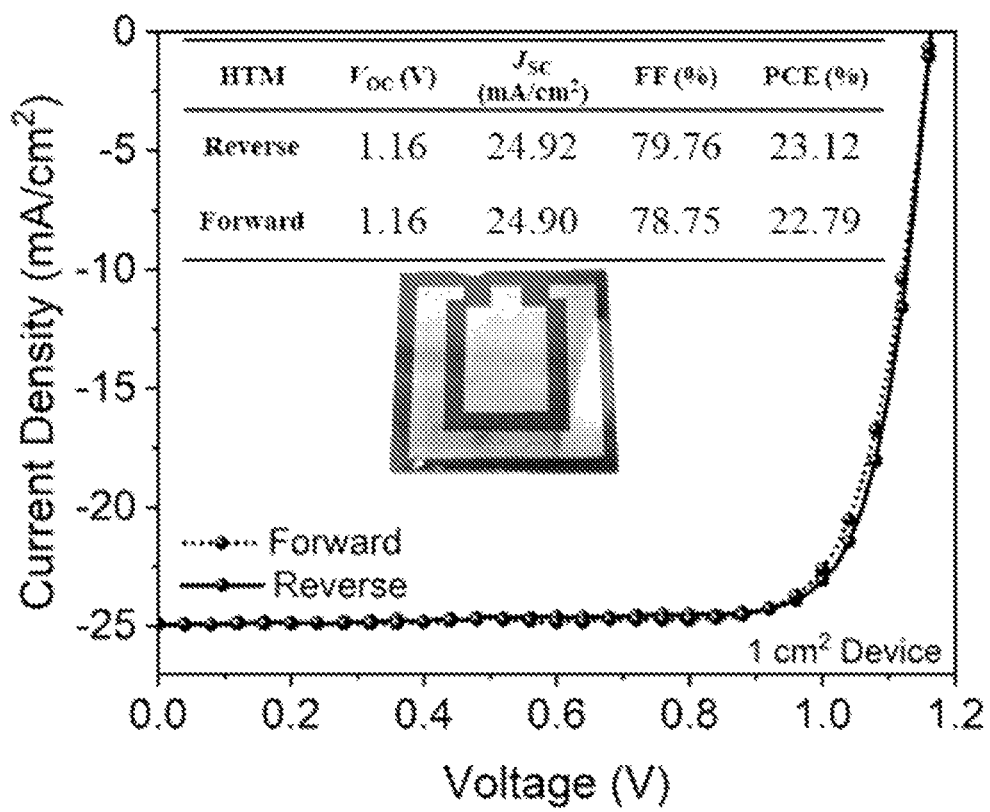
FIG. 27 is a graph showing J-V curves of champion 1-$cm^2$ PVSCs based on PTAA-P1.

FIG. 27 illustrates the performance of large-area inverted PVSCs with PTAA-P1. The PEC can reach 23.12%, which is the record efficiency so far, indicating PTAA-P1 is suitable for upscaling of inverted perovskite solar cells towards commercialization.

Figure 28:
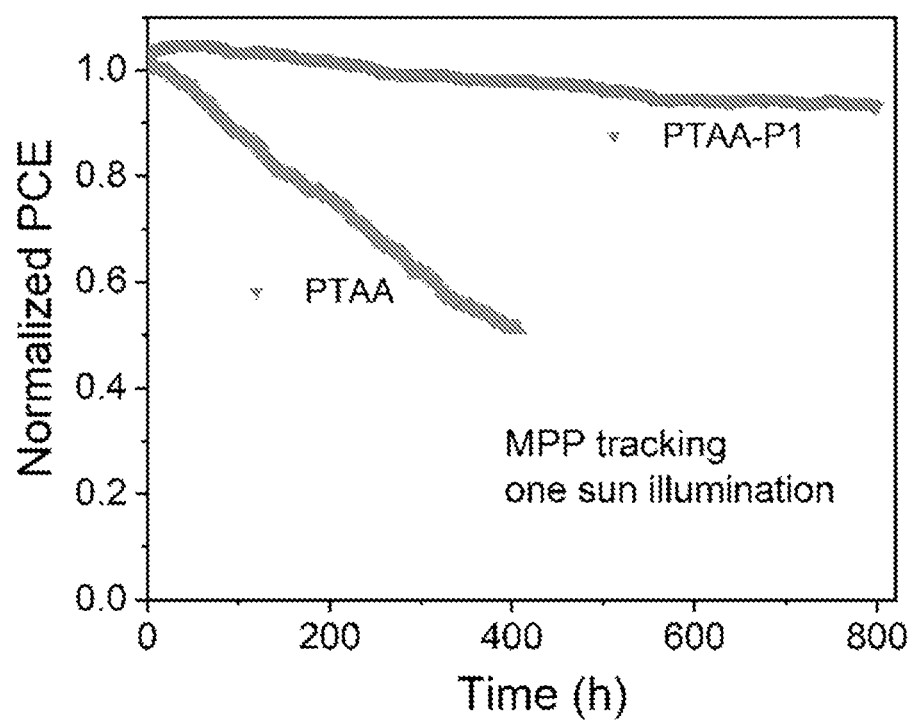
FIG. 28 is a graph showing normalized PCEs of unencapsulated PVSCs at MPP under continuous one-sun illumination in an $N_2$ atmosphere.

FIG. 28 shows the normalized PCE under simulated AM 1.5G illumination in an N$_2$ atmosphere. The stability of PTAA-P1-based devices outperforms PTAA-based devices, where PTAA-P1-based devices retain 93% of their initial PCE retained after 800 h, implying the outstanding photostability of PTAA-P1-based perovskite solar cells.

Figure 29:
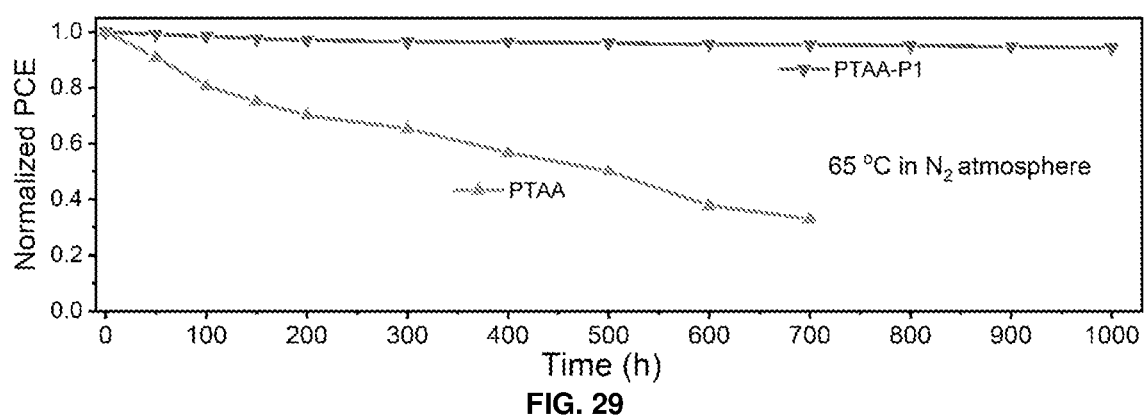
FIG. 29 is a graph showing the thermal stability of unencapsulated PTAA-P1- and PTAA-based PVSCs heated at 65° C. in an $N_2$ atmosphere for 1000 hours.

FIG. 29 shows the thermal stability of unencapsulated PTAA-P1- and PTAA-based devices heated at 65° C. in an $N_2$ atmosphere. PTAA-P1-based devices show significantly enhanced thermal stability in comparison with PTAA-based devices, demonstrating their extraordinary stability towards commercialization.

Materials

In this invention, Toluene and Tetrahydrofuran are dried by adding metallic sodium and distilled. The starting materials and reagents for PTAA-P1 and PTAA-P2 synthesis are purchased from Adamas (Titan Scientific, Shanghai), J&K (China), and TCI are used without further purification. Ammonium salts, including Caesium iodide (CsI), Formamidinium iodide (FAI), and methylammonium bromide (MABr), are purchased from Dysol. Lead iodide ($PbI_2$) and lead bromide ($PbBr_2$) are purchased from TCI. Poly[bis(4-phenyl) (2,4,6-trimethylphenyl)amine] (PTAA), $C_{60}$, bathocuproine (BCP, purity of 99.9%) and methylammonium chloride (MACl) are purchased from Xi'an Polymer Light Technology Corporation, Xi'an, China. 2,4,6-trimethylaniline (compound 1), bromobenzene (compound 2), 3,5-dibromopyridine (compound 6), 2,5-dibromopyridine (compound 7), 1-bromo-4-iodobenzene (compound 8), di-p-tolylamine (compound 9), 2-isopropoxy-4,4,5,5-tetramethyl-1,3,2-dioxaborolane (compound 11) and other reagents are purchased from Adamas (Titan Scientific, Shanghai). N,N-Dimethylformamide (DMF), dimethyl sulfoxide (DMSO) and chlorobenzene (CB) are purchased from J&K. All the chemical reagents are analytical grade and used without any further purification.

Example 1

Synthesis of Two Novel Polymers, PTAA-P1 and PTAA-P2

A simple backbone engineering strategy (FIG. 1A) is developed to modify the structure of PTAA by incorporating a small amount of pyridine groups (1:20 relative molar ratio to monomers of PTAA) into the polyarylamine backbone via random Suzuki copolymerization.

Specifically, two polymers, denoted as PTAA-P1 (3,5-sites) and PTAA-P2 (2,5-site), have been obtained by changing the linkage sites of pyridine units. (FIG. 1B). The linkage change can be observed to influence the molecular conformation, HTM properties, perovskite crystallization, and ultimately the device performance.

1.1 Synthesis of Compound 3

Compound 3: A mixture of compound 1 (3.0 g, 22 mmol), 2 (6.97 g, 44 mmol), NaOtBu (6.4 g, 66 mmol), $PtBu_3$ (270 mg, 1.3 mmol), $Pd(OAc)_2$ (150 mg, 0.67 mmol) in dry toluene (10 mL) is heated to reflux under $N_2$ for 24 h. Then the mixture is cooled to room temperature, extracted with DCM, and the crude product is purified through column chromatography ($SiO_2$, petroleum ether/DCM, 3/1, v/v) to afford compound 3 (5. Ig, 80%) as a white solid.

1.2 Synthesis of Compound 4

Compound 4: NBS (8.10 g, 45.5 mmol) is added in the $CHCl_3$ (40 mL) solution of compound 3 (6.38 g, 22.2 mmol). The mixture is stirred at room temperature for 4 h and 50 mL water is added and extracted. The crude product is purified through column chromatography ($SiO_2$, petroleum ether/DCM, 3/1, v/v) to afford compound 4 (8.9 g, 90%) as a white solid.

1.3 Synthesis of Compound 5

Compound 5: A mixture of compound 4 (2.7 g, 6 mmol), Bis(pinacolato)diboron (4.6 g, 18 mmol), $CH_3COOK$ (1.76 g, 18 mmol) and $Pd(dppf)_2Cl_2$ (294 mg, 0.36 mmol) in dry 1,4-Dioxane (15 mL) is heated to reflux under $N_2$ for 24 h and then cooled to room temperature.

The mixture is extracted by DCM and the combined organic layer is dried by anhydrous $Na_2SO_4$. After concentration using a rotary evaporator, the crude product is purified through column chromatography ($SiO_2$, petroleum ether/DCM, 1/1, v/v) to afford compound 5 (2.43 g, 75%) as a white solid.

1.4 PTAA-P1: A mixture of compound 5 (324 mg, 1.60 mmol), 4 (240 mg, 0.54 mmol), 6 (14 mg, 0.06 mmol), $K_2CO_3$ (828 mg, 6.0 mmol), phase transfer catalyst aliquat 336 (2 drops), P(o-tol)3 (33 mg, 0.11 mmol) and $Pd_2(dba)_3$ (33 mg, 0.04 mmol) in dry toluene (10 mL) and distilled water (5 mL) is heated to 100° C. under nitrogen for 72 h. Then the mixture is cooled to room temperature, extracted with DCM and washed with an aqueous solution of L-cysteine. After concentrated, the solution is dropped into acetone, and the precipitation is filtrated and washed with acetone. Further purification of the crude products is conducted by exhaustive Soxhlet extraction with methanol (50 mL), acetone (50 mL) and hexane (50 mL) for 24 h successively. The product is collected after being dried under vacuum at 50° C. for 24 h and afforded as a gray solid (0.31 g, 94%). Mn=19.2 kDa and Đ=2.1. 1H NMR (400 MHz, Chloroform-d) 68.88 (s, ArH), 8.72 (s, ArH), 8.35 (s, ArH), 7.97 (s, ArH), 7.40 (d, J=8.4 Hz, 4H, ArH), 7.02 (d, J=8.3 Hz, 4H, ArH), 6.95 (s, 2H, ArH), 2.33 (s, 3H, —CH3), 2.03 (s, 6H, —CH3). 13C NMR (101 MHz, Chloroform-d) δ 144.68, 139.97, 137.65, 136.81, 133.02, 129.95, 126.93, 119.82, 21.0, 18.60.

Following the above synthetic procedure with compound 4, 5 and 7, PTAA-P2 is obtained as a gray solid (0.32 g, 97%). Mn=22.0 kDa and Đ=2.2.1H NMR (600 MHz, Chloroform-d) δ 8.84 (s, ArH), 8.35 (s, ArH), 7.88-7.66 (m, ArH), 7.40 (d, J=8.4 Hz, 4H, ArH), 7.02 (d, J=8.2 Hz, 4H, ArH), 6.95 (s, 2H, ArH), 2.33 (s, 3H, —CH3), 2.03 (s, 6H, —CH3). 13C NMR (151 MHz, Chloroform-d) δ 144.69, 139.98, 137.66, 136.82, 133.03, 129.96, 126.94, 119.82, 21.09, 18.61.

The structures of two HTMs (PTAA-P1 and PTAA-P2) are well characterized and confirmed by NMR spectra, of which the number-average molecular weights (Mn) are estimated to be 19.2 kDa for PTAA-P1 with a polydispersity index (Đ) of 2.1 and 22.0 kDa for PTAA-P2 with a Đ of 2.2, respectively.

Example 2

Device Fabrication of ITO/HTM/Perovskite/$C_{60}$/Bathocuproine/Ag

Glass/ITO substrates (15 $\Omega sq^{-1}$) are sequentially cleaned by sonication with detergent for 30 min, deionized water, acetone, isopropyl alcohol, and ethanol for 20 min, respectively. Then, the glass/ITO substrates are dried at 70° C. in an oven. Before use, the substrates are treated with oxygen plasma for 15 min. The PTAA solution (2 mg/mL), PTAA-P1 (0.5 mg/ml), or PTAA-P2 (0.5 mg/ml) solution with different concentrations in CB is spin-coated onto the ITO substrates at 5000 rpm for 30 s followed by annealing at 100° C. for 10 min. For the triple-cation perovskites, 1.73 M perovskite precursor solution is prepared by mixing 22.47 mg CsI, 283.74 mg FAI, 3.68 mg MABr, 851.94 mg PbI$_2$ (9% PbI$_2$ excess) and 12.70 mg PbBr$_2$ in 1 mL DMF:DMSO (5:1/v:v) mixed solvent with a chemical formula of Cs$_{0.05}$(FA$_{0.98}$MA$_{0.02}$)$_{0.95}$Pb(I$_{0.98}$Br$_{0.02}$)$_3$, and then 15.5 mol % MACl is added to the perovskite precursor solution and stirred for 2 h. The perovskite solution is spin-coated onto glass/ITO/HTM substrate at 1000 rpm for 10 s and 5000 rpm for 40 s, 250 µL CB is dripped onto the center of the film at 12 s before the end of spin coating, followed by annealing on a hotplate at 110° C. for 20 min. Then, 25 nm C$_{60}$, 6 nm BCP and 100 nm silver are thermally evaporated under high vacuum (<4×10$^{-6}$ Torr) sequentially. The device area is characterized as 0.0809 cm$^2$ by a metal shadow mask.

Example 3

The Coordination of Pyridine Units with Pb$^{2+}$

To demonstrate the coordination of pyridine units with Pb$^{2+}$, M1 and M2, are first synthesized as monomers of PTAA-P1 and PTAA-P2, respectively (FIG. 2A). M1 and M2 are used to investigate how the two pyridine units act with Pb$^{2+}$ in the PVS by the addition of PbI$_2$. The inventors collect and compare the 1H nuclear magnetic resonance (NMR) spectra of M1 and M2 before and after the addition of PbI$_2$.

Compound 10: A mixture of compound 8 (5.66 g, 20 mmol), compound 9 (3.94 g, 20 mmol), CuCl (198 mg, 2 mmol), KOH (5.60 g, 100 mmol), 1,10-Phenanthroline (360 mg, 2 mmol) and dry toluene (10 mL) are heated to reflux under N$_2$ for 24 h and then cooled to room temperature. The mixture is extracted by DCM and the combined organic layer is dried by anhydrous Na$_2$SO$_4$. After concentration using a rotary evaporator, the crude product is purified through column chromatography (SiO$_2$, petroleum ether/DCM, 3/1, v/v) to afford compound (5.14 g, 80%) as a white solid.

Compound 12: Compound 10 (5.28 g, 15 mmol) is dissolved in dry THF (20 mL) and cooled to −78° C. nBuLi (14 mL, 22.5 mmol) is added dropwise to the reaction solution and stirred for 1 hour. Compound 11 (4.6 mL, 22.5 mmol) is added to the mixture and the reaction solution gradually rose to room temperature for overnight. The mixture is extracted by DCM and the combined organic layer is dried by anhydrous Na$_2$SO$_4$. After concentration using a rotary evaporator, the crude product is purified through column chromatography (SiO$_2$, petroleum ether/DCM, 1/1, V/V) to afford compound 12 (3.59 g, 60%) as a white solid.

3.1 Synthesis of M1 and M2

M1: A mixture of compound 12 (240 mg, 0.60 mmol), 6 (47 mg, 0.20 mmol), K$_2$CO$_3$ (166 mg, 1.20 mmol), phase transfer catalyst aliquat 336 (2 drops), P(o-tol)$_3$ (8 mg, 0.3 mmol) and Pd$_2$(dba)$_3$ (8 mg, 0.01 mmol) in dry toluene (10 mL) and distilled water (5 mL) is heated to 100° C. under nitrogen for 24 h. Then the mixture is cooled to room temperature and extracted with DCM. The organic layer is collected, washed with water, and dried with anhydrous Na$_2$SO$_4$. After concentration using a rotary evaporator, the crude product is purified by column chromatography on the silica gel using petroleum ether/DCM (V/V:1/1) as the eluent to obtain M1 as a yellow solid (102 mg, 82%). 1H NMR (600 MHz, DMSO-d6) δ 8.76 (s, 2H, ArH), 8.16 (s, 1H, ArH), 7.69 (d, J=8.3 Hz, 4H, ArH), 7.15 (d, J=7.9 Hz, 8H, ArH), 6.97 (d, J=8.0 Hz, 12H, ArH), 2.28 (s, 12H, —CH3). 13C NMR (150 MHz, Chloroform-d) δ 148.44, 145.86, 144.96, 136.14, 133.04, 131.50, 130.31, 130.02, 127.71, 124.98, 122.32, 20.89. HRMS (APCI): m/z calcd. for C$_{45}$H$_{39}$N$_3$ [M+H]$^+$: 622.3217, found 622.3211. NMR spectra and HRMS spectra confirmed the structure of M1.

Following the above synthetic procedure with compound 12 and 7, M2 is obtained as a light-yellow solid (200 mg, 70%). 1H NMR (600 MHz, Chloroform-d) δ 8.85 (d, J=2.2 Hz, 1H, ArH), 7.87-7.85 (m, 3H, ArH), 7.68 (d, J=8.3 Hz, 1H, ArH), 7.46 (d, J=8.3 Hz, 2H, ArH), 7.10-7.03 (m, 20H, ArH), 2.33 (s, 12H, —CH3). 13C NMR (150 MHz, Chloroform-d) δ 155.12, 148.97, 148.20, 147.41, 145.00, 134.22, 133.63, 132.96, 132.93, 131.82, 130.25, 130.00, 129.96, 127.40, 127.32, 124.99, 124.93, 122.43, 122.01, 119.49, 20.89. HRMS (APCI): m/z calcd. for C$_{45}$H$_{39}$N$_3$ [M+H]$^+$: 622.3217, found 622.3218. NMR spectra and HRMS spectra confirmed the structure of M2.

3.2 Interaction of M1/M2 and Pb$^{2+}$

Such backbone engineering is expected to enhance the hydrophilicity of HTMs, form strong interaction with atop perovskite layer through the Pb—N bond, regulate the molecular conformation, and promote the perovskite growth.

As shown in FIGS. 2B and 2C, the protonic peaks assigned to the pyridine ring in M1 and M2 all shift slightly to the low field after interacting with PbI$_2$. The shifting degree of M1 is more pronounced, indicating its superior lead coordination ability.

3.3 Interaction of PTAA-P1/PTAA-P2 with Pb$^{2+}$

The perovskite/HTM interaction is further confirmed by the Fourier-transform infrared spectroscopy (FTIR) spectra (FIGS. 3A and 3B). When mixed with PbI$_2$, the $v_{C=N}$ peak of PTAA-P1 and PTAA-P2 shifts to a higher wavenumber, and the shoulder peak of PTAA-P1 at 1614 cm$^1$ disappeared, suggesting their coordination with Pb$^{2+}$.

The comprehensive results of NMR and FTIR well prove that PTAA-P1 and PTAA-P2 could interact with perovskite through the coordination of the pyridine units with Pb$^{2+}$ ions, which is thus expected to modulate the wettability and anchoring capability of PTAA-P1 and PTAA-P2 to affect the interface and crystallinity of perovskite films when serving as the HTL in inverted PVSCs.

Example 4

The Characteristics of PTAA, PTAA-P1, and PTAA-P2

The normalized UV-vis absorption spectra of three HTMs in film and solution state are shown in FIGS. 4A and 4B. Similar to that of PTAA, the bandgaps of PTAA-P1 and PTAA-2 are calculated to be 2.97 and 2.95 eV (Table 1), respectively, ensuring their low parasitic absorption in PVSCs. Furthermore, thermogravimetric analysis (FIG. 5 and Table 1) indicates that PTAA-P1 and PTAA-P2 exhibit slightly higher decomposition temperatures (Td, which refers to 5% of weight loss) than PTAA. In light of PTAA, the decomposition step at ~100° C. is potentially ascribed to the wide range of Mn (6000-15000 g mol$^{-1}$) commercialized PTAA. Some polymers with smaller Mn would decompose at a lower temperature. The higher thermal decomposition temperature ($T_{ds}$, 5% weight loss) of PTAA-P1 and PTAA-P2 than PTAA could be attributed to its higher molecular weight.

In addition, the cyclic voltammetry (CV) measures the highest occupied molecular orbital (HOMO) levels of PTAA-P1, PTAA-P2, and PTAA (FIG. 6). The HOMOs are estimated based on the oxidation potential (Eox) versus Fc/Fc+ and the equation of EHOMO=−(Eox+4.80 eV). At the same time, the LUMOs are obtained using the equation of ELLUMO=EHOMO+Eg (Eg is calculated from FIG. 4A). As summarized in Table 1, $E_{HOMO}$ of PTAA-P1 (−5.22 eV) and PTAA-P2 (5.24 eV) are deeper than PTAA (−5.17 eV), which could be beneficial to the realization of larger $V_{OC}$ of fabricated devices owing to the lower built-in electric field and reduced thermionic losses (FIG. 7). The variation of HOMO levels is also confirmed by the ultraviolet photoelectron spectroscopy (UPS) measurement (FIGS. 8A-8C), according to which the HOMO levels of PTAA, PTAA-P1, and PTAA-P2 are obtained to be −5.10, −5.14, and −5.20 eV, respectively.

TABLE 1

Photophysical and charge transfer properties of PTAA, PTAA-P1, and PTAA-P2.

| HTM | Mn g mol$^{-1}$ | PDI | $\lambda_{sol}$ nm | $\lambda_{film}$ nm | $E_g$ eV | $E_{HOMO}$ eV | $E_{LUMO}$ eV | Mobility cm$^2$V$^{-1}$s$^{-1}$ | $T_d$ °C |
|---|---|---|---|---|---|---|---|---|---|
| PTAA | 6000-15000 | — | 388 | 378 | 2.97 | −5.17 | −2.20 | 2.01 × 10$^{-4}$ | 485 |
| PTAA-P1 | 19200 | 2.1 | 387 | 382 | 2.97 | −5.22 | −2.25 | 1.95 × 10$^{-4}$ | 498 |
| PTAA-P2 | 22000 | 2.2 | 389 | 382 | 2.95 | −5.24 | −2.29 | 1.54 × 10$^{-4}$ | 503 |

Example 5

Determination of Hole Mobility, Defect Density, and Density Hole Extraction/Transport Efficiencies of PTAA, PTAA-P1, and PTAA-P2

5.1 Measurement of Hole Mobility

The hole mobilities represent potential as dopant-free HTMs for effective hole transport measured by the space charge limited current (SCLC) method (FIG. 9). Space-charge-limited-current (SCLC) method is employed to determine the hole mobilities of the HTMs by fabricating hole-only devices with the configuration of ITO/PEDOT: PSS/HTMs/MoO$_3$/Ag (Wang, J. et al. 2021 and Sun, X. et al. 2021). PEDOT:PSS (AI 4083) is spin coated on ITO substrate at 4000 rpm for 30 s followed by annealing at 100° C. for 30 min. Then concentrated HTM solutions are spin coated on PEDOT; PSS at 4000 rpm for 30 s followed by annealing at 100° C. for 10 min. Sequentially, 6 nm MoO$_3$ and 100 nm Ag are thermally evaporated. The J-V curve can be classified into three regions (Ohmic response region (n=1), trap-filling region, and trap-filled SCLC region (n=2)) and N refers to the slope of linear regions. According to the Mott-Gurney law:

$$J = 9\varepsilon_r\varepsilon_0\mu V^2/8L^3$$

where $\varepsilon_r$ is the relative dielectric constant (~3), $\varepsilon_0$ is the vacuum permittivity, p is the carrier mobility and L is the film thickness. The carrier mobility can be calculated by fitting the SCLC region. The thickness of films is determined to be 40 nm (PTAA) and 90 nm (PTAA-P1, PTAA-P2) using a DektakXT stylus profiler. Hole mobilities of 2.01×10$^{-4}$ cm$^2$ V$^{-1}$ s$^{-1}$, 1.95×10$^{-4}$ cm$^2$ V$^{-1}$ s$^{-1}$ and 1.54×10$^{-4}$ cm$^2$ V$^{-1}$ s$^{-1}$ are obtained for PTAA, PTAA-P1 and PTAA-P2, respectively.

The results illustrate that the introduction of pyridine units into the backbone induces a slight decrease in hole mobility (Table 1), which, however, remains to cope with the requirements of dopant-free HTMs.

5.2 the Measurement of Hole Extraction/Transport Efficiencies

In addition, the steady-state photoluminescence (PL) spectra (FIG. 10A) and time-resolved PL spectra (FIG. 10B) of perovskites on different substrates are measured to compare their hole extraction/transport efficiencies. Hole extraction/transport efficiencies refer to the ability for effective interfacial charge transfer. More significant PL quenching and shorter PL lifetime are observed for the perovskite films grown on the PTAA-P1 and PTAA-P2 compared with those from PTAA (Table 2), indicating that the former has more effective hole extraction/transport efficiency, possibly due to their more compatible energy levels with perovskites well as optimized perovskite/HTM interface.

TABLE 2

The TRPL fitting results of perovskite films coated on different substrates.

| | $\tau_1$ (ns) | $A_1$ | % of $\tau_1$ | $\tau_2$ (ns) | $A_2$ | 9% of $\tau_2$ | $\tau_{avg}$ (ns) |
|---|---|---|---|---|---|---|---|
| Glass/perovskite | 53.18 | 83.70 | 2.02 | 1084.36 | 196.67 | 97.98 | 1062.45 |
| Glass/PTAA/Perovskite | 5.32 | 39.189 | 2.17 | 103.13 | 90.99 | 97.83 | 101.01 |
| Glass/PTAA-P1/Perovskite | 4.34 | 57.33 | 5.73 | 44.19 | 92.69 | 94.27 | 41.21 |
| Glass/PTAA-P2/Perovskite | 4.31 | 72.37 | 7.61 | 40.73 | 92.89 | 92.39 | 37.96 |

Example 6

HTM/Perovskite Interaction and Molecular Regularity

To obtain deep insights into how the incorporation of pyridine units and the change of linkage sites affect the molecular conformation of HTMs, density-functional theory (DFT) simulation is conducted, and FAPbI$_3$ perovskite is selected as a model. In the simulation, two repeating units are used, each containing ten TPAs. The side-view images of stabilized surface molecule structures of PTAA, PTAA-P1, and PTAA-P2 after interacting with perovskites are shown in FIG. 11A. The conformation of top-layer molecules is selected for simulation due to their significant influence on device performance and stability. Obviously, the incorporation of pyridine units with distinct linkage sites results in significantly different molecular regularity, with the trend of increasing conformational disorder from PTAA-P1 to PTAA-P2 and PTAA. Specifically, PTAA exhibits an irregular conformation with the polymer backbone intertwined and certain parts tilting up. In contrast, PTAA-P1 shows an unwrinkled structure with favorable uniformity and regularity, and its backbone arranges in a straight line without obvious fluctuation. PTAA-P2 also presents a relatively linear configuration, whereas there is a section obviously tilting up, which could be attributed to the different linkage sites requiring varied chain geometries to stabilize the interface. The front-view images of the geometrically optimized molecular structures in FIG. 11B further verifies the aforementioned conclusion, indicating that the optimized structure of PTAA-P1 and PTAA-P2 may benefit the charge transfer at the interface.

Moreover, to quantitatively compare the regularity of these three polymer HTMs, the vertical distances between the N atoms in the backbones of polymers and the (100) plane of perovskite bottom surface are calculated (see inset of FIG. 12), which are defined as the N-to-(100) plane vertical distances. Two repeating units of these polymers are used for the simulation. As portrayed in FIG. 12, PTAA and PTAA-P2 both exhibit a broad distribution of N-to-(100) plane vertical distances from 4 to 12 Å. In contrast, PTAA-P1 excitingly demonstrates narrow distance distribution between 4 and 6 Å, suggesting the superior planarity of PTAA-P1 than that of PTAA-P2 and PTAA. Moreover, FIG. 13 illustrates the quantitative analysis of N-to-(100) plane vertical distance evolution as a function of time. It can be seen that once exposed to perovskites, PTAA-P1 can approach the (100) plane more promptly than PTAA and PTAA-P2 in the first 20 ps and subsequently require another 40 ps to form a stable and uniform conformation to interact with perovskites. PTAA and PTAA-P2 not only move toward perovskites slowly but also lack the stabilization process, resulting in an inferior regularity. It is also noteworthy that the final average N-to-(100) plane distance of PTAA ($5.81 \pm 2.13$ Å) is much larger than that of PTAA-P1 ($4.78 \pm 0.36$ Å) and PTAA-P2 ($4.82 \pm 2.28$ Å), suggesting the loose interfacial interactions between PTAA and perovskites due to the absence of pyridine units. Moreover, the collected X-ray photoelectron spectra are shown in FIGS. 14A and 14B further indicate that the binding energies of the Pb 4f and I 3d core levels of PTAA-P1- and PTAA-P2-covered perovskite films all have a negative shift relative to that of the pristine perovskites, thus experimentally confirming the interactions between synthesized HTMs and perovskites.

Example 7

Figure 15B:
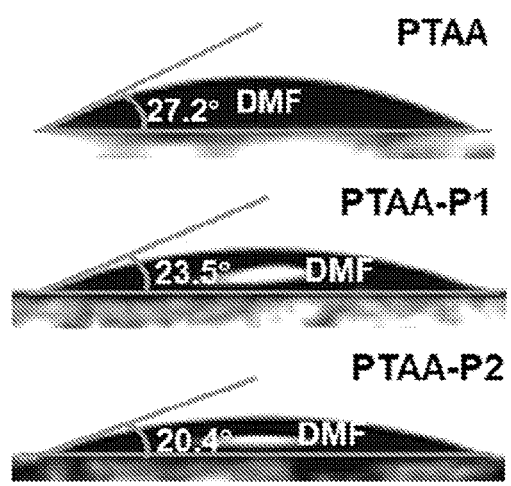
FIG. 15B shows contact angle measurements of different HTM films with respect to DMF drop.
Figure 15C:
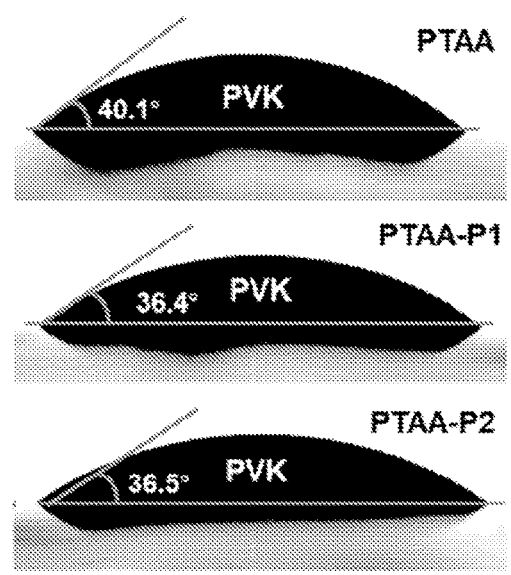
FIG. 15C shows contact angle measurements of different HTM films with respect to perovskite precursor drop.

The Perovskites Grown on PTAA-P1 have Enhanced Crystallinity and Satisfying Bottom Contact Relative to Those Deposited on PTAA-P2 and PTAA Afterwards, the inventors investigate the morphology, back contact, and crystallinity of perovskites grown on different HTMs with a FA-dominated composition of $Cs_{0.05}(FA_{0.98}MA_{0.02})_{0.95}Pb(I_{0.98}Br_{0.02})_3$. As the wettability of HTL is critical for the growth of perovskites, the contact angles of HTM films with respect to water, dimethylformamide (DMF), and perovskite precursors are measured, as shown in FIGS. 15A-15C, which indicates that PTAA-P1 and PTAA-P2 have similar but stronger hydrophilicity than PTAA, which could be favorable for the deposition of utterly covered dense perovskite layers. Furthermore, the cross-sectional and top-view scanning electron microscopy (SEM) images of perovskite films on different HTMs are presented in FIGS. 16A and 16B, respectively. Compared with other films, PTAA-P1-induced perovskite films exhibit much smoother morphology and better bottom contact, but disordered perovskite grains can be clearly observed in those films grown on PTAA. Without intending to be limited by theory, it is believed that the inferior film quality and poor bottom contact of PTAA-P2-based perovskite films could be attributed to its poorer molecular regularity than PTAA-P1, which affects the growth of perovskite.

Subsequently, the crystallinity of different perovskite films is measured by grazing-incidence wide-angle X-ray scattering (GIWAXS) and X-ray diffraction (XRD) measurements. As shown in FIG. 17, the diffraction rings at q values of 1 and 2 $Å^{-1}$ correspond to (100) and (200) planes, respectively. PTAAP1-based perovskite films exhibit obviously brighter diffraction rings of these two planes than those of the PTAA and PTAA-P2-based films, indicating the enhanced perovskite crystallinity. Besides, as depicted in FIG. 18, the XRD patterns of PTAA-P1-based perovskite films also demonstrate much higher diffraction intensity than those of PTAA and PTAA-P2, and the full-width at half-maximum of (100) plane decreases, further confirming the crystallinity modified by changing HTMs. The improvement of crystallinity could be ascribed to the enhanced planarity and wettability of PTAA-P1 and PTTA-P2, which it is believed could reduce the surface tension force to promote perovskite growth. These results thus strongly suggest the positive impact of PTAA-P1 HTM on facilitating the crystallinity of perovskite films.

Example 8

The Perovskites Grown on PTAA-P1 have a Lower Defect Density than Those Deposited on PTAA-P2 and PTAA 8.1 Calculation of Defect Density of the Device The hole-only device with the configuration of ITO/HTM/perovskite/$MoO_3$/Ag is prepared to calculate the defect density N according to Wang, D. et al. (2021) and Li, F. et al. (2020). ITO/HTM/perovskite is deposited with the same procedure as solar device fabrication, in which PTAA (2 mg/ml), PTAA-P1 (0.5 mg/ml) and PTAA-P2 (0.5 mg/ml) are spin coated onto ITO substrate, followed by thermal annealing at 100° C. for 10 min. 1.73 M perovskite precursor solution is prepared by mixing 22.47 mg CsI, 283.74 mg FAI, 3.68 mg MABr, 851.94 mg $PbI_2$ (9% $PbI_2$ excess) and 12.70 mg $PbBr_2$ in 1 mL DMF:DMSO (5:1/v:v) mixed solvent with a chemical formula of $Cs_{0.05}(FA_{0.98}MA_{0.02})_{0.95}Pb(I_{0.98}Br_{0.02})_3$, and then 15.5 mol % MACI is added to the perovskite precursor solution and stirred for 2 h. The perovskite solution is spin-coated onto glass/ITO/HTM substrate at 1000 rpm for 10 s and 5000 rpm for 40 s, 250 µL CB is dripped onto the center of film at 12 s before the end of spin coating, followed by annealing on a hotplate at 110° C. for 20 min. Then, 6 nm $MoO_3$ and 100 nm Ag are evaporated. In the SCLC regime, the current is dominated by charge carriers injected from the contacts, and the current-voltage characteristics become quadratic ($I \sim V^2$). FIG. 19 shows the J-V curves of the fabricated devices on a double logarithmic scale, which comprises the Ohmic region, the trap-filled limit (TFL) region, and the Child region. In the TFL region, the trap-state density $N_t$ can be calculated by the following equation:

$$N_t = \frac{2\varepsilon\varepsilon_0 V_{TFL}}{qL^2}$$

where $\varepsilon$ and $\varepsilon_0$ are the relative dielectric constant and vacuum permittivity, respectively. $V_{TFL}$ is the onset voltage of TFL region, q and L are elementary charge and perovskite thin film thickness. The thickness of perovskites in this invention is measured to be 730 nm by the DektakXT stylus profiler for the calculation in the equation.

Then, hole-only devices with the configuration of ITO/HTM/perovskite/MoO$_3$/Ag are fabricated to compare the defect densities of perovskite films grown on PTAA-P1 and PTAA, with corresponding J-V curves presented in FIG. 7A. The calculated defect densities can be effectively reduced from $5.90 \times 10^{15}$ to $2.95 \times 10^{15}$ cm$^{-3}$ when using PTAA-P1 to substitute PTAA, which is attributed to the improved film morphology and enhanced crystallinity. Moreover, it is noteworthy that the reduced defect density of PTAA-P1-based devices will be beneficial in suppressing the non-radiative recombination of devices.

8.2 TEM Measurement and Data Analysis

To further reveal the change of defects, the perovskite polycrystals are characterized utilizing transmission electron microscopy (TEM) under low-dose conditions.

TEM Sample Preparation: A lift-off method is used to prepare the TEM sample 6. In detail, PTAA-P1 or PTAA (10 mg/ml) is first spin-coated on ITO glass. Then, perovskites (0.8 M) are deposited on HTM using the same composition and method as Example 8.1. Afterward, the glass/ITO/HTM/perovskite sample is immersed in CB solvent in a 20 ml vial for 3 hours, during which the HTM is dissolved, and the perovskite film is dispersed into CB. Next, the glass/ITO substrate is taken out of the vial. The perovskite film dispersion in the vial is further washed with CB for 5 times. Last, the dispersion of perovskite film is dripped onto the copper grid to finish the sample preparation. The lift-off method ensures that the TEM results can show the real crystallinity of perovskites films in the device.

TEM measurement: The TEM images are collected on a double Cs-corrected JEOL ARM 300F2 TEM operated at 300 kV, using a K3 camera under low-dose conditions. The first few images within 2-5 seconds are used to decrease the damage of electron irradiation. Experimental SAED and FFT are compared with simulated SAED and FFT under the experimental condition to verify the validity of low-dose results.

Regarding the PTAA-P1-based perovskites, no defect is clearly observed in the low magnification TEM image (FIG. 20A), and the corresponding selected-area electron diffraction (SAED) patterns along [100] zone axis exhibit identical features with the simulated diffraction intrinsic model (FIG. 20B). High-resolution TEM (HRTEM) images of perovskites in FIG. 20C further illustrates that the atomic column is in good agreement with the superposed atomic model of FAPbI$_3$ perovskite along the [100] zone axis. In comparison, the TEM image and corresponding SAED patterns (FIGS. 21A and 21B) of PTAA-based samples exhibit a high density of fringes along [100] zone axis as indicated by the red arrow in FIG. 21A, revealing the existence of increased defect density in perovskites. The HRTEM in FIG. 21C further suggests that the fringes are composed of a high density of edge dislocations (marked T), as clearly indicated by the corresponding fast Fourier transform (FFT) and inverse FFT using the [011] spatial frequencies (FIGS. 21D and 21E).

Example 9

Photovoltaic Performance of Fabricated Inverted Perovskite Solar Cells

To study the photovoltaic performance of different HTMs, inverted PVSCs with a typical device structure of ITO/HTM/perovskite/C$_{60}$/bathocuproine/Ag are fabricated (FIG. 22), in which FA-dominated perovskites Cs$_{0.05}$(FA$_{0.98}$MA$_{0.02}$)$_{0.95}$Pb(I$_{0.98}$Br$_{0.02}$)$_3$, are employed as the photoactive layer, and HTMs are used without dopants.

The fabrication procedures follows. Glass/ITO substrates (15 Ωsq$^{-1}$) are sequentially cleaned by sonication with detergent for 30 min, deionized water, acetone, isopropyl alcohol and ethanol for 20 min, respectively. Then, the glass/ITO substrates are dried at 70° C. in an oven. Before use, the substrates are treated with oxygen plasma for 15 min. The PTAA solution (2 mg/mL), PTAA-P1 (0.5 mg/ml) or PTAA-P2 (0.5 mg/ml) solution with different concentration in CB is spin-coated onto the ITO substrates at 5000 rpm for 30 s followed by annealing at 100° C. for 10 min. For the triple-cation perovskites, 1.73 M perovskite precursor solution is prepared by mixing 22.47 mg CsI, 283.74 mg FAI, 3.68 mg MABr, 851.94 mg PbI$_2$ (9% PbI$_2$ excess) and 12.70 mg PbBr$_2$ in 1 mL DMF:DMSO (5:1/v:v) mixed solvent with a chemical formula of Cs$_{0.05}$(FA$_{0.98}$MA$_{0.02}$)$_{0.95}$Pb(I$_{0.98}$Br$_{0.02}$)$_3$, and then 15.5 mol % MACl is added to the perovskite precursor solution and stirred for 2 h. The perovskite solution is spin-coated onto glass/ITO/HTM substrate at 1000 rpm for 10 s and 5000 rpm for 40 s, 250 μL CB is dripped onto the center of film at 12 s before the end of spin coating, followed by annealing on a hotplate at 110° C. for 20 min. Then, 25 nm C$_{60}$, 6 nm BCP and 100 nm silver are thermally evaporated under high vacuum (<$4 \times 10^{-6}$ Torr) sequentially.

The inventors prepare 20 devices for each batch of PTAA-, PTAA-P1- and PTAA-P2-based perovskite devices. The performance data are summarized in Table 3. The inventors pick the best devices of each group, called champion devices, and label their data in the parentheses in Table 3 for each parameter. The current density-voltage (J-V) curves of champion devices based on different HTMs are shown in FIG. 8B, with corresponding parameters summarized in Table 3.

TABLE 3

Photovoltaic parameters of devices based on different HTMs. The (±) sign represents the standard deviation of 20 devices.

| HTM | Voc [V] | Jsc [mA cm$^{-2}$] | FF [%] | PCE [%] |
|---|---|---|---|---|
| PTAA | 1.12 ± 0.01 (1.13) | 25.42 ± 0.08 (25.45) | 77.70 ± 1.47 (79.53) | 22.19 ± 0.44 (22.85) |
| PTAA-P1 | 1.16 ± 0.01 (1.17) | 25.45 ± 0.07 (25.50) | 83.01 ± 0.98 (83.28) | 24.49 ± 0.28 (24.89) |
| PTAA-P2 | 1.13 ± 0.01 (1.14) | 25.45 ± 0.07 (25.47) | 80.30 ± 0.83 (80.73) | 23.17 ± 0.16 (23.42) |

J-V curves of champion PVSCs are shown in FIG. 23A. PTAA-based PVSCs exhibit a common PCE of 22.85%, with V$_{OC}$ of 1.13 V, short-circuit current density (J$_{SC}$) of 25.45 mA cm$^{-2}$, and FF of 79.53%, while PTAA-P2-based devices show a slightly higher efficiency of 23.42% due to the improved V$_{OC}$ of 1.14 V and FF of 80.73%. Encouragingly, for PTAA-P1-based devices, a remarkable PCE of 24.89% has been realized, with an enhanced $V_{OC}$ of 1.17 V, $J_{SC}$ of 25.50 mA cm$^{-2}$, and FF of 83.28%. The enhanced PCEs derived from two new polymer HTMs ought to result from the backbone engineering strategy, which not only improves the hole transport of resulting HTMs, but also facilitates the growth of atop perovskite films to realize enhanced crystallinity and bottom contact. In FIG. 23B, the integrated current density calculated from the external quantum efficiency (EQE) spectrum of the PTAA-P1-based champion device is 24.84 mA cm$^{-2}$, which is well consistent with the values measured from J-V curves. The reverse and forward scan curves of the champion PTAA-P1-based device in FIG. 24 indicate negligible hysteresis.

Based on 20 devices in a batch, average $V_{OCS}$/PCEs are obtained as 1.12 V/22.19% and 1.16 V/24.49% of PTAA and PTAA-P1-based devices, respectively (FIGS. 25A and 25B), indicating the superior device reproducibility (FIGS. 25C and 25D). PTAA-P1-based PVSCs exhibited higher FF than PTAA-based devices with good reproducibility. In addition, the champion device is also measured at the MPP with an applied voltage of 1.02 V, leading to a stabilized efficiency of 24.44% without decay within 300 s (FIG. 26).

Moreover, since PTAA-P1 exhibits enhanced wettability toward perovskite precursor solution, large-area inverted PVSCs (1 cm$^2$) with an impressive PCE of 23.12% are successfully demonstrated (reverse scan, FIG. 27), with a $V_{OC}$ of 1.16 V, a $J_{SC}$ of 24.92 mA cm$^{-2}$, and an FF of 79.76%, which proves the great potential of PTAA-P1 for upscaling of inverted PVSCs.

In addition, a comparative study on the device operational stability between PTAA-P1 and PTAA is conducted. First, the PCEs evolution of unencapsulated devices is monitored through MPP tracking under simulated AM 1.5G illumination in an N$_2$ atmosphere (FIG. 28). Obviously, compared with PTAA-based devices, PTAA-P1-based devices demonstrate enhanced operational stability than PTAA-based devices, with over 93% of its initial PCE retains after 800 h. The efficiency of PTAA-based devices dramatically decreases to 50% of its initial value only after 400 h. Moreover, the thermal stability of unencapsulated devices heated at 65° C. in N$_2$ atmosphere is examined (FIG. 29). Significantly enhanced thermal stability is observed for PTAA-P1-based device relative to PTAA-based devices, which encouragingly maintains about 94% of its original PCE after 1000 h of heating. The enhanced photo and thermal stability could be ascribed to the improved interfacial adhesion strength and crystallinity, as well as reduced defects density since the defects and pinholes at grain boundaries and interfaces are persistently the starting points of device degradation.

Non-Limiting Embodiments of the Invention

1. A hole-transporting material for a perovskite solar cell containing poly(bis(4-phenyl) (2,4,6-trimethylphenyl) amine) and at least one pyridine.
2. The hole-transporting material for a perovskite solar cell according to embodiment 1, where the pyridine is linked to the poly(bis(4-phenyl) (2,4,6-trimethylphenyl)amine).
3. The hole-transporting material for a perovskite solar cell according to embodiment 2, where a linkage position is selected from a 3,5-sites of the pyridine, a 2,5-site of the pyridine, and a combination thereof.
4. The hole-transporting material for a perovskite solar cell according to any one of embodiments 1 to 3, where a relative molar ratio of the pyridine to the monomer of poly(bis(4-phenyl) (2,4,6-trimethylphenyl)amine) in the hole-transporting materials ranges from about 1:100 to about 1:10, or about 1:20.
5. The hole-transporting material for a perovskite solar cell according to any one of embodiments 1 to 4, where the hole-transporting material is substantially free of a dopant.
6. The hole-transporting material for a perovskite solar cell according to any one of embodiments 1 to 5, where the hole-transporting material includes a structure selected from Formula (I), Formula (II) or a combination thereof:

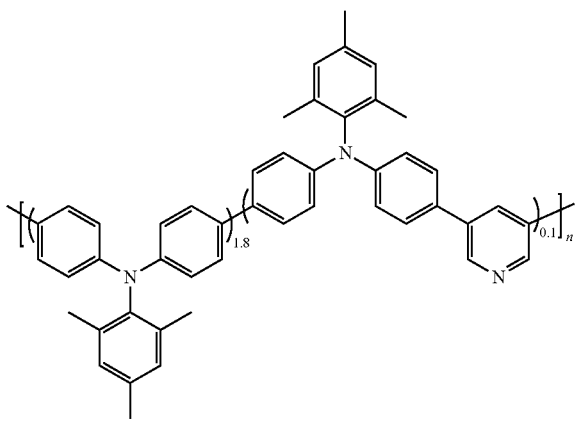

Formula (I)

PTTA-P1

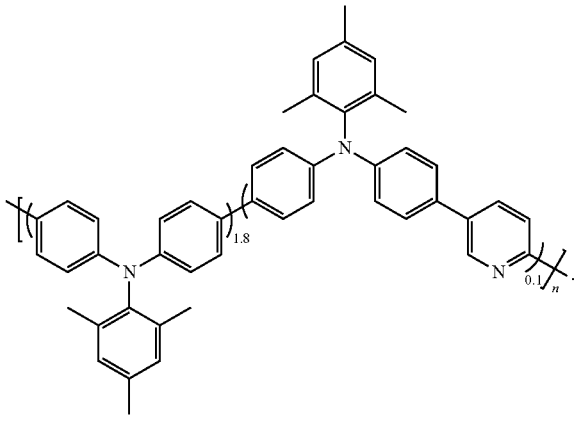

Formula (II)

PTAA-P2

7. A perovskite solar cell comprising a hole-transporting layer, where the hole-transporting layer comprises the hole-transporting material according to any one of embodiments 1 to 6.
8. The perovskite solar cell according to embodiment 7, where the perovskite solar cell contains an inverted-structure perovskite solar cell.
9. The perovskite solar cell according to embodiment 8, where the hole-transporting layer is a p-type hole-transporting layer.
10. The perovskite solar cell according to embodiment 8, further contains a substrate, a perovskite active layer, an n-type electron-transporting layer, a blocking layer and a metal electrode.

11. The perovskite solar cell according to embodiment 10, where the perovskite active layer consists essentially of $Pb^2$.
12. The perovskite solar cell according to embodiment 11, where the pyridine in the hole-transporting material coordinates with the $Pb^{2+}$ through a Pb—N bond.
13. The perovskite solar cell according to any one of embodiments 10 to 12, further containing a substrate, and where the p-type hole-transporting layer is coated on the substrate, where the perovskite active layer is coated on the p-type hole-transporting layer, where the n-type electron-transporting layer is coated on the perovskite active layer, where the blocking layer is coated on the n-type electron-transporting layer, and where the metal electrode is coated on the blocking layer.
14. The perovskite solar cell according to any one of embodiments 10 to 13, where the substrate is selected from glass/ITO substrate, glass/FTO substrate, PET/ITO substrate, and a combination thereof.
15. The perovskite solar cell according to any one of embodiments 10 to 14, where the electron-transporting layer is selected from $C_{60}$, ZnO, $C_{70}$, and a combination thereof.
16. The perovskite solar cell according to any one of embodiments 10 to 15, where the blocking layer is selected from bathocuproine, ALD-$SnO_x$, and $V_2O_5$, and a combination thereof.
17. The perovskite solar cell according to any one of embodiments 10 to 16, where the metal electrode is selected from silver, copper, gold, and a combination thereof.
18. The perovskite solar cell according to embodiment 13, where the substrate includes ITO, the n-type electron-transporting layer includes $C_{60}$, the blocking layer includes bathocuproin, and the metal electrode includes silver.
19. A method for fabricating the perovskite solar cell of any one of embodiments 7 to 18, comprising the steps of:
(a) providing a substrate;
(b) providing a hole-transporting material;
(c) coating the hole-transporting material onto the substrate;
(d) providing a perovskite precursor; and
(e) coating the perovskite precursor onto the substrate of (c).
20. The method for fabricating the perovskite solar cell of embodiment 19, where the hole-transporting material is prepared in solution and perovskite precursor is prepared in solution.

It should be understood that the above only illustrates and describes examples whereby the present invention may be carried out, and that modifications and/or alterations may be made thereto without departing from the spirit of the invention.

It should also be understood that certain features of the invention, which are, for clarity, described in the context of separate embodiments, may also be provided in combination in a single embodiment. Conversely, various features of the invention which are, for brevity, described in the context of a single embodiment, may also be provided separately, or in any suitable subcombination.

All references specifically cited herein are hereby incorporated by reference in their entireties. However, the citation or incorporation of such a reference is not necessarily an admission as to its appropriateness, citability, and/or availability as prior art to/against the present invention.

What is claimed is:
1. A hole-transporting material for a perovskite solar cell comprising poly(bis(4-phenyl) (2,4,6-trimethylphenyl) amine) and at least one pyridine, wherein the at least one pyridine is covalently linked to the poly(bis(4-phenyl) (2,4,6-trimethylphenyl) amine).
2. The hole-transporting material for a perovskite solar cell according to claim 1, wherein a linkage position is selected from the group consisting of a 3,5-site of the pyridine, a 2, 5-site of the pyridine, and a combination thereof.
3. The hole-transporting material for a perovskite solar cell according to claim 1, wherein a relative molar ratio of the pyridine to the monomer of poly(bis(4-phenyl) (2,4,6-trimethylphenyl) amine) in the hole-transporting materials ranges from about 1:100 to about 1:10, or about 1:20.
4. The hole-transporting material for a perovskite solar cell according to claim 1, wherein the hole-transporting material is substantially free of a dopant.
5. The hole-transporting material for a perovskite solar cell according to claim 1, wherein the hole-transporting material comprises a structure selected from the group consisting of Formula (I), Formula (II), and a combination thereof:

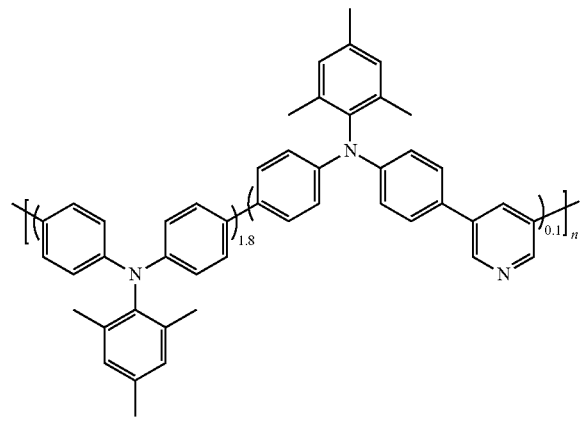

Formula (I)

PTTA-P1

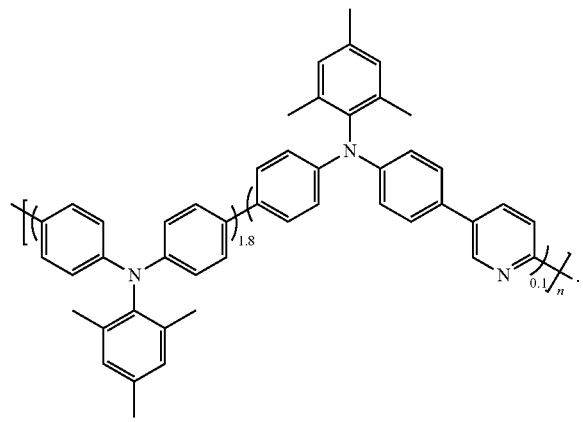

Formula (II)

PTAA-P2

6. A perovskite solar cell comprising a hole-transporting layer, wherein the hole-transporting layer comprises the hole-transporting material according to claim 1.

7. The perovskite solar cell according to claim 6, wherein the perovskite solar cell comprises an inverted-structure perovskite solar cell.

8. The perovskite solar cell according to claim 7, wherein the hole-transporting layer is a p-type hole-transporting layer.

9. The perovskite solar cell according to claim 8, further comprises a substrate, a perovskite active layer, an n-type electron-transporting layer, a blocking layer and a metal electrode.

10. The perovskite solar cell according to claim 9, wherein the perovskite active layer includes $Pb^{2+}$ arranged to coordinate with the pyridine in the hole-transporting material through a Pb—N bond.

11. The perovskite solar cell according to claim 9, further comprising a substrate, and wherein the p-type hole-transporting layer is coated on the substrate, wherein the perovskite active layer is coated on the p-type hole-transporting layer, wherein the n-type electron-transporting layer is coated on the perovskite active layer, wherein the blocking layer is coated on the n-type electron-transporting layer, and wherein the metal electrode is coated on the blocking layer.

12. The perovskite solar cell according to claim 9, wherein the substrate is selected from the group consisting of glass/ITO substrate, glass/FTO substrate, PET/ITO substrate, and a combination thereof.

13. The perovskite solar cell according to claim 9, wherein the electron-transporting layer is selected from the group consisting of $C_{60}$, ZnO, $C_{70}$, and a combination thereof.

14. The perovskite solar cell according to claim 9, wherein the blocking layer is selected from the group consisting of bathocuproine, ALD-SnOx, and $V_2O_5$, and a combination thereof.

15. The perovskite solar cell according to claim 9, wherein the metal electrode is selected from the group consisting of silver, copper, gold, and a combination thereof.

16. The perovskite solar cell according to claim 11, wherein the substrate comprises ITO, the n-type electron-transporting layer comprises $C_{60}$, the blocking layer comprises bathocuproin, and the metal electrode comprises silver.

17. A method for fabricating the perovskite solar cell of claim 6, comprising the steps of:
  (a) providing a substrate;
  (b) providing a hole-transporting material;
  (c) coating the hole-transporting material onto the substrate;
  (d) providing a perovskite precursor; and
  (e) coating the perovskite precursor onto the substrate of (c).

18. The method for fabricating the perovskite solar cell of claim 17, wherein the hole-transporting material is prepared in solution and perovskite precursor is prepared in solution.

* * * * *